(12) United States Patent
Vorbach

(10) Patent No.: US 8,803,552 B2
(45) Date of Patent: Aug. 12, 2014

(54) RECONFIGURABLE SEQUENCER STRUCTURE

(71) Applicant: Pact XPP Technologies AG, Munich (DE)

(72) Inventor: Martin Vorbach, Lingenfeld (DE)

(73) Assignee: Pact XPP Technologies AG, Munich (DE)

( * ) Notice: Subject to any disclaimer, the term of this patent is extended or adjusted under 35 U.S.C. 154(b) by 1 day.

(21) Appl. No.: 13/626,047

(22) Filed: Sep. 25, 2012

(65) Prior Publication Data

US 2013/0024657 A1    Jan. 24, 2013

Related U.S. Application Data

(63) Continuation of application No. 13/040,769, filed on Mar. 4, 2011, now Pat. No. 8,310,274, which is a continuation of application No. 12/836,364, filed on Jul. 14, 2010, now Pat. No. 7,928,763, which is a continuation of application No. 12/541,299, filed on Aug. 14, 2009, now Pat. No. 7,782,087, which is a continuation of application No. 12/082,073, filed on Apr. 7, 2008, now Pat. No. 7,602,214, which is a continuation of application No. 10/526,595, filed as application No. PCT/EP03/09957 on Sep. 8, 2003, now Pat. No. 7,394,284.

(30) Foreign Application Priority Data

| Sep. 6, 2002 | (DE) | 102 41 812 |
|---|---|---|
| Apr. 4, 2003 | (DE) | 103 15 295 |
| May 15, 2003 | (DE) | 103 21 834 |
| Aug. 28, 2003 | (EP) | 03019428 |

(51) Int. Cl.
*H03K 19/173* (2006.01)
*G06F 15/78* (2006.01)

(52) U.S. Cl.
CPC .......... *H03K 19/173* (2013.01); *G06F 15/7867* (2013.01)
USPC ............................................... 326/38; 326/41

(58) Field of Classification Search
CPC .......................... H03K 19/173; G06F 15/7867
USPC .............................................. 326/37–41, 46
See application file for complete search history.

(56) References Cited

U.S. PATENT DOCUMENTS

| 3,564,506 A | 2/1971 | Bee et al. |
| 3,681,578 A | 8/1972 | Stevens |

(Continued)

FOREIGN PATENT DOCUMENTS

| DE | 42 21 278 | 1/1994 |
| DE | 44 16 881 | 11/1994 |

(Continued)

OTHER PUBLICATIONS

Agarwal, A., et al., "APRIL: A Processor Architecture for Multiprocessing," Laboratory for Computer Science, MIT, Cambridge, MA, IEEE 1990, pp. 104-114.

(Continued)

*Primary Examiner* — Don Le
(74) *Attorney, Agent, or Firm* — Edward P. Heller, III

(57) ABSTRACT

A cell element field for data processing, having function cell means for execution of algebraic and/or logic functions and memory cell means for receiving, storing and/or outputting information is described. Function cell-memory cell combinations are formed in which a control connection leads from the function cell means to the memory cell means.

4 Claims, 6 Drawing Sheets

(56) References Cited

U.S. PATENT DOCUMENTS

| | | |
|---|---|---|
| 3,753,008 A | 8/1973 | Guarnaschelli |
| 3,754,211 A | 8/1973 | Rocher et al. |
| 3,855,577 A | 12/1974 | Vandierendonck |
| 3,956,589 A | 5/1976 | Weathers et al. |
| 4,151,611 A | 4/1979 | Sugawara et al. |
| 4,233,667 A | 11/1980 | Devine et al. |
| 4,414,547 A | 11/1983 | Knapp et al. |
| 4,498,134 A | 2/1985 | Hansen et al. |
| 4,498,172 A | 2/1985 | Bhavsar |
| 4,566,102 A | 1/1986 | Hefner |
| 4,571,736 A | 2/1986 | Agrawal et al. |
| 4,590,583 A | 5/1986 | Miller |
| 4,591,979 A | 5/1986 | Iwashita |
| 4,594,682 A | 6/1986 | Drimak |
| 4,623,997 A | 11/1986 | Tulpule |
| 4,646,300 A | 2/1987 | Goodman et al. |
| 4,663,706 A | 5/1987 | Allen et al. |
| 4,667,190 A | 5/1987 | Fant et al. |
| 4,682,284 A | 7/1987 | Schrofer |
| 4,686,386 A | 8/1987 | Tadao |
| 4,706,216 A | 11/1987 | Carter |
| 4,720,778 A | 1/1988 | Hall et al. |
| 4,720,780 A | 1/1988 | Dolecek |
| 4,739,474 A | 4/1988 | Holsztynski |
| 4,748,580 A | 5/1988 | Ashton et al. |
| 4,760,525 A | 7/1988 | Webb |
| 4,761,755 A | 8/1988 | Ardini et al. |
| 4,791,603 A | 12/1988 | Henry |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Stolfo et al. |
| 4,870,302 A | 9/1989 | Freeman |
| 4,873,666 A | 10/1989 | Lefebvre et al. |
| 4,882,687 A | 11/1989 | Gordon |
| 4,884,231 A | 11/1989 | Mor et al. |
| 4,891,810 A | 1/1990 | de Corlieu et al. |
| 4,901,268 A | 2/1990 | Judd |
| 4,910,665 A | 3/1990 | Mattheyses et al. |
| 4,918,440 A | 4/1990 | Furtek et al. |
| 4,939,641 A | 7/1990 | Schwartz et al. |
| 4,959,781 A | 9/1990 | Rubinstein et al. |
| 4,967,340 A | 10/1990 | Dawes |
| 4,972,314 A | 11/1990 | Getzinger et al. |
| 4,992,933 A | 2/1991 | Taylor |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,031,179 A | 7/1991 | Yoshida et al. |
| 5,034,914 A | 7/1991 | Osterlund |
| 5,036,473 A | 7/1991 | Butts et al. |
| 5,036,493 A | 7/1991 | Nielsen |
| 5,041,924 A | 8/1991 | Blackborow et al. |
| 5,043,978 A | 8/1991 | Nagler et al. |
| 5,047,924 A | 9/1991 | Fujioka et al. |
| 5,055,997 A | 10/1991 | Sluijter et al. |
| 5,065,308 A | 11/1991 | Evans |
| 5,070,475 A | 12/1991 | Normoyle et al. |
| 5,072,178 A | 12/1991 | Matsumoto |
| 5,076,482 A | 12/1991 | Kozyrski et al. |
| 5,081,375 A | 1/1992 | Pickett et al. |
| 5,081,575 A | 1/1992 | Hiller et al. |
| 5,099,447 A | 3/1992 | Myszewski |
| 5,103,311 A | 4/1992 | Sluijter et al. |
| 5,109,503 A | 4/1992 | Cruickshank et al. |
| 5,113,498 A | 5/1992 | Evan et al. |
| 5,115,510 A | 5/1992 | Okamoto et al. |
| 5,119,290 A | 6/1992 | Loo et al. |
| 5,123,109 A | 6/1992 | Hillis |
| 5,128,559 A | 7/1992 | Steele |
| 5,142,469 A | 8/1992 | Weisenborn |
| 5,144,166 A | 9/1992 | Camarota et al. |
| 5,193,202 A | 3/1993 | Jackson et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,212,777 A | 5/1993 | Gove et al. |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,243,238 A | 9/1993 | Kean |
| 5,245,616 A | 9/1993 | Olson |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,511 A | 2/1994 | Robinson et al. |
| 5,287,532 A | 2/1994 | Hunt |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,355,508 A | 10/1994 | Kan |
| 5,361,373 A | 11/1994 | Gilson |
| 5,365,125 A | 11/1994 | Goetting et al. |
| 5,379,444 A | 1/1995 | Mumme |
| 5,386,154 A | 1/1995 | Goetting et al. |
| 5,386,155 A | 1/1995 | Steele et al. |
| 5,386,518 A | 1/1995 | Reagle et al. |
| 5,392,437 A | 2/1995 | Matter et al. |
| 5,408,643 A | 4/1995 | Katayose |
| 5,410,723 A | 4/1995 | Schmidt et al. |
| 5,412,795 A | 5/1995 | Larson |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,435,000 A | 7/1995 | Boothroyd et al. |
| 5,440,245 A | 8/1995 | Galbraith et al. |
| 5,440,538 A | 8/1995 | Olsen et al. |
| 5,442,790 A | 8/1995 | Nosenchuck |
| 5,444,394 A | 8/1995 | Watson et al. |
| 5,448,186 A | 9/1995 | Kawata |
| 5,450,022 A | 9/1995 | New |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,477,525 A | 12/1995 | Okabe |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,493,663 A | 2/1996 | Parikh |
| 5,497,498 A | 3/1996 | Taylor |
| 5,502,838 A | 3/1996 | Kikinis |
| 5,504,439 A | 4/1996 | Tavana |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |

(56) References Cited

U.S. PATENT DOCUMENTS

| | | |
|---|---|---|
| 5,521,837 A | 5/1996 | Frankle et al. |
| 5,522,083 A | 5/1996 | Gove et al. |
| 5,525,971 A | 6/1996 | Flynn |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,568,624 A | 10/1996 | Sites et al. |
| 5,570,040 A | 10/1996 | Lytle et al. |
| 5,572,710 A | 11/1996 | Asano et al. |
| 5,574,927 A | 11/1996 | Scantlin |
| 5,574,930 A | 11/1996 | Halverson, Jr. et al. |
| 5,581,731 A | 12/1996 | King et al. |
| 5,581,734 A | 12/1996 | DiBrino et al. |
| 5,583,450 A | 12/1996 | Trimberger et al. |
| 5,584,013 A | 12/1996 | Cheong et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,600,265 A | 2/1997 | El Gamal et al. |
| 5,600,597 A | 2/1997 | Kean et al. |
| 5,600,845 A | 2/1997 | Gilson |
| 5,602,999 A | 2/1997 | Hyatt |
| 5,603,005 A | 2/1997 | Bauman et al. |
| 5,606,698 A | 2/1997 | Powell |
| 5,608,342 A | 3/1997 | Trimberger |
| 5,611,049 A | 3/1997 | Pitts |
| 5,617,547 A | 4/1997 | Feeney et al. |
| 5,617,577 A | 4/1997 | Barker et al. |
| 5,619,720 A | 4/1997 | Garde et al. |
| 5,625,806 A | 4/1997 | Kromer |
| 5,625,836 A | 4/1997 | Barker et al. |
| 5,627,992 A | 5/1997 | Baror |
| 5,634,131 A | 5/1997 | Matter et al. |
| 5,635,851 A | 6/1997 | Tavana |
| 5,642,058 A | 6/1997 | Trimberger et al. |
| 5,646,544 A | 7/1997 | Iadanza |
| 5,646,545 A | 7/1997 | Trimberger et al. |
| 5,649,176 A | 7/1997 | Selvidge et al. |
| 5,649,179 A | 7/1997 | Steenstra et al. |
| 5,652,529 A | 7/1997 | Gould et al. |
| 5,652,894 A | 7/1997 | Hu et al. |
| 5,655,069 A | 8/1997 | Ogawara et al. |
| 5,655,124 A | 8/1997 | Lin |
| 5,656,950 A | 8/1997 | Duong et al. |
| 5,657,330 A | 8/1997 | Matsumoto |
| 5,659,785 A | 8/1997 | Pechanek et al. |
| 5,659,797 A | 8/1997 | Zandveld et al. |
| 5,675,262 A | 10/1997 | Doung et al. |
| 5,675,743 A | 10/1997 | Mavity |
| 5,675,757 A | 10/1997 | Davidson et al. |
| 5,675,777 A | 10/1997 | Glickman |
| 5,677,909 A | 10/1997 | Heide |
| 5,680,583 A | 10/1997 | Kuijsten |
| 5,682,491 A | 10/1997 | Pechanek et al. |
| 5,682,544 A | 10/1997 | Pechanek et al. |
| 5,687,325 A | 11/1997 | Chang |
| 5,694,602 A | 12/1997 | Smith |
| 5,696,791 A | 12/1997 | Yeung |
| 5,696,976 A | 12/1997 | Nizar et al. |
| 5,701,091 A | 12/1997 | Kean |
| 5,705,938 A | 1/1998 | Kean |
| 5,706,482 A | 1/1998 | Matsushima et al. |
| 5,713,037 A | 1/1998 | Wilkinson et al. |
| 5,717,890 A | 2/1998 | Ichida et al. |
| 5,717,943 A | 2/1998 | Barker et al. |
| 5,727,229 A | 3/1998 | Kan et al. |
| 5,732,209 A | 3/1998 | Vigil et al. |
| 5,734,869 A | 3/1998 | Chen |
| 5,734,921 A | 3/1998 | Dapp et al. |
| 5,737,516 A | 4/1998 | Circello et al. |
| 5,737,565 A | 4/1998 | Mayfield |
| 5,742,180 A | 4/1998 | DeHon et al. |
| 5,745,734 A | 4/1998 | Craft et al. |
| 2,748,872 A | 5/1998 | Norman |
| 5,748,979 A | 5/1998 | Trimberger |
| 5,752,035 A | 5/1998 | Trimberger |
| 5,754,459 A | 5/1998 | Telikepalli |
| 5,754,820 A | 5/1998 | Yamagami |
| 5,754,827 A | 5/1998 | Barbier et al. |
| 5,754,871 A | 5/1998 | Wilkinson et al. |
| 5,754,876 A | 5/1998 | Tamaki et al. |
| 5,760,602 A | 6/1998 | Tan |
| 5,761,484 A | 6/1998 | Agarwal et al. |
| 5,768,629 A | 6/1998 | Wise et al. |
| 5,773,994 A | 6/1998 | Jones |
| 5,778,237 A | 7/1998 | Yamamoto et al. |
| 5,778,439 A | 7/1998 | Timberger et al. |
| 5,781,756 A | 7/1998 | Hung |
| 5,784,313 A | 7/1998 | Trimberger et al. |
| 5,784,630 A | 7/1998 | Saito et al. |
| 5,784,636 A | 7/1998 | Rupp |
| 5,794,059 A | 8/1998 | Barker et al. |
| 5,794,062 A | 8/1998 | Baxter |
| 5,801,547 A | 9/1998 | Kean |
| 5,801,715 A | 9/1998 | Norman |
| 5,801,958 A | 9/1998 | Dangelo et al. |
| 5,802,290 A | 9/1998 | Casselman |
| 5,804,986 A | 9/1998 | Jones |
| 5,815,004 A | 9/1998 | Trimberger et al. |
| 5,815,715 A | 9/1998 | Kayhan |
| 5,815,726 A | 9/1998 | Cliff |
| 5,821,774 A | 10/1998 | Veytsman et al. |
| 5,828,229 A | 10/1998 | Cliff et al. |
| 5,828,858 A | 10/1998 | Athanas et al. |
| 5,831,448 A | 11/1998 | Kean |
| 5,832,288 A | 11/1998 | Wong |
| 5,838,165 A | 11/1998 | Chatter |
| 5,838,988 A | 11/1998 | Panwar et al. |
| 5,841,973 A | 11/1998 | Kessler et al. |
| 5,844,422 A | 12/1998 | Trimberger et al. |
| 5,844,888 A | 12/1998 | Markkula, Jr. et al. |
| 5,848,238 A | 12/1998 | Shimomura et al. |
| 5,854,918 A | 12/1998 | Baxter |
| 5,857,097 A | 1/1999 | Henzinger et al. |
| 5,857,109 A | 1/1999 | Taylor |
| 5,859,544 A | 1/1999 | Norman |
| 5,860,119 A | 1/1999 | Dockser |
| 5,862,403 A | 1/1999 | Kanai et al. |
| 5,867,691 A | 2/1999 | Shiraishi |
| 5,867,723 A | 2/1999 | Chin et al. |
| 5,870,620 A | 2/1999 | Kadosumi et al. |
| 5,884,075 A | 3/1999 | Hester et al. |
| 5,887,162 A | 3/1999 | Williams et al. |
| 5,887,165 A | 3/1999 | Martel et al. |
| 5,889,533 A | 3/1999 | Lee |
| 5,889,982 A | 3/1999 | Rodgers et al. |
| 5,892,370 A | 4/1999 | Eaton et al. |
| 5,892,961 A | 4/1999 | Trimberger |
| 5,892,962 A | 4/1999 | Cloutier |
| 5,894,565 A | 4/1999 | Furtek et al. |
| 5,895,487 A | 4/1999 | Boyd et al. |
| 5,898,602 A | 4/1999 | Rothman et al. |
| 5,901,279 A | 5/1999 | Davis, III |
| 5,913,925 A | 6/1999 | Kahle et al. |
| 5,915,099 A | 6/1999 | Takata et al. |
| 5,915,123 A | 6/1999 | Mirsky et al. |
| 5,924,119 A | 7/1999 | Sindhu et al. |
| 5,926,638 A | 7/1999 | Inoue |
| 5,933,023 A | 8/1999 | Young |

(56) References Cited

U.S. PATENT DOCUMENTS

| | | |
|---|---|---|
| 5,933,642 A | 8/1999 | Greenbaum et al. |
| 5,936,424 A | 8/1999 | Young et al. |
| 5,943,242 A | 8/1999 | Vorbach et al. |
| 5,956,518 A | 9/1999 | DeHon et al. |
| 5,960,193 A | 9/1999 | Guttag et al. |
| 5,960,200 A | 9/1999 | Eager et al. |
| 5,966,143 A | 10/1999 | Breternitz, Jr. |
| 5,966,534 A | 10/1999 | Cooke et al. |
| 5,970,254 A | 10/1999 | Cooke et al. |
| 5,978,260 A | 11/1999 | Trimberger et al. |
| 5,978,583 A | 11/1999 | Ekanadham et al. |
| 5,996,048 A | 11/1999 | Cherabuddi et al. |
| 5,996,083 A | 11/1999 | Gupta et al. |
| 5,999,990 A | 12/1999 | Sharrit et al. |
| 6,003,143 A | 12/1999 | Kim et al. |
| 6,011,407 A | 1/2000 | New |
| 6,014,509 A | 1/2000 | Furtek et al. |
| 6,020,758 A | 2/2000 | Patel et al. |
| 6,020,760 A | 2/2000 | Sample et al. |
| 6,021,490 A | 2/2000 | Vorbach et al. |
| 6,023,564 A | 2/2000 | Trimberger |
| 6,023,742 A | 2/2000 | Ebeling et al. |
| 6,026,478 A | 2/2000 | Dowling |
| 6,026,481 A | 2/2000 | New et al. |
| 6,034,538 A | 3/2000 | Abramovici |
| 6,035,371 A | 3/2000 | Magloire |
| 6,038,650 A | 3/2000 | Vorbach et al. |
| 6,038,656 A | 3/2000 | Martin et al. |
| 6,044,030 A | 3/2000 | Zheng et al. |
| 6,045,585 A | 4/2000 | Blainey |
| 6,047,115 A | 4/2000 | Mohan et al. |
| 6,049,222 A | 4/2000 | Lawman |
| 6,049,866 A | 4/2000 | Earl |
| 6,052,524 A | 4/2000 | Pauna |
| 6,052,773 A | 4/2000 | DeHon et al. |
| 6,054,873 A | 4/2000 | Laramie |
| 6,055,619 A | 4/2000 | North et al. |
| 6,058,266 A | 5/2000 | Megiddo et al. |
| 6,058,469 A | 5/2000 | Baxter |
| 6,064,819 A | 5/2000 | Franssen et al. |
| 6,072,348 A | 6/2000 | New et al. |
| 6,075,935 A | 6/2000 | Ussery et al. |
| 6,076,157 A | 6/2000 | Borkenhagen et al. |
| 6,077,315 A | 6/2000 | Greenbaum et al. |
| 6,078,736 A | 6/2000 | Guccione |
| 6,081,903 A | 6/2000 | Vorbach et al. |
| 6,084,429 A | 7/2000 | Trimberger |
| 6,085,317 A | 7/2000 | Smith |
| 6,086,628 A | 7/2000 | Dave et al. |
| 6,088,795 A | 7/2000 | Vorbach et al. |
| 6,092,174 A | 7/2000 | Roussakov |
| RE36,839 E | 8/2000 | Simmons et al. |
| 6,096,091 A | 8/2000 | Hartmann |
| 6,105,105 A | 8/2000 | Trimberger |
| 6,105,106 A | 8/2000 | Manning |
| 6,108,760 A | 8/2000 | Mirsky et al. |
| 6,118,724 A | 9/2000 | Higginbottom |
| 6,119,181 A | 9/2000 | Vorbach et al. |
| 6,122,719 A | 9/2000 | Mirsky et al. |
| 6,125,072 A | 9/2000 | Wu |
| 6,125,408 A | 9/2000 | McGee et al. |
| 6,127,908 A | 10/2000 | Bozler et al. |
| 6,128,720 A | 10/2000 | Pechanek et al. |
| 6,134,166 A | 10/2000 | Lytle et al. |
| 6,137,307 A | 10/2000 | Iwanczuk et al. |
| 6,145,072 A | 11/2000 | Shams et al. |
| 6,150,837 A | 11/2000 | Beal et al. |
| 6,150,839 A | 11/2000 | New et al. |
| 6,154,048 A | 11/2000 | Iwanczuk et al. |
| 6,154,049 A | 11/2000 | New |
| 6,154,826 A | 11/2000 | Wulf et al. |
| 6,157,214 A | 12/2000 | Marshall |
| 6,170,051 B1 | 1/2001 | Dowling |
| 6,172,520 B1 | 1/2001 | Lawman et al. |
| 6,173,419 B1 | 1/2001 | Barnett |
| 6,173,434 B1 | 1/2001 | Wirthlin et al. |
| 6,178,494 B1 | 1/2001 | Casselman |
| 6,185,256 B1 | 2/2001 | Saito et al. |
| 6,185,731 B1 | 2/2001 | Maeda et al. |
| 6,188,240 B1 | 2/2001 | Nakaya |
| 6,188,650 B1 | 2/2001 | Hamada et al. |
| 6,191,614 B1 | 2/2001 | Schultz et al. |
| 6,198,304 B1 | 3/2001 | Sasaki |
| 6,201,406 B1 | 3/2001 | Iwanczuk et al. |
| 6,202,163 B1 | 3/2001 | Gabzdyl et al. |
| 6,202,182 B1 | 3/2001 | Abramovici et al. |
| 6,204,687 B1 | 3/2001 | Schultz et al. |
| 6,211,697 B1 | 4/2001 | Lien et al. |
| 6,212,544 B1 | 4/2001 | Borkenhagen et al. |
| 6,212,650 B1 | 4/2001 | Guccione |
| 6,215,326 B1 | 4/2001 | Jefferson et al. |
| 6,216,223 B1 | 4/2001 | Revilla et al. |
| 6,219,833 B1 | 4/2001 | Solomon et al. |
| RE37,195 E | 5/2001 | Kean |
| 6,230,307 B1 | 5/2001 | Davis et al. |
| 6,240,502 B1 | 5/2001 | Panwar et al. |
| 6,243,808 B1 | 6/2001 | Wang |
| 6,247,147 B1 | 6/2001 | Beenstra et al. |
| 6,249,756 B1 | 6/2001 | Bunton et al. |
| 6,252,792 B1 | 6/2001 | Marshall et al. |
| 6,256,724 B1 | 7/2001 | Hocevar et al. |
| 6,260,114 B1 | 7/2001 | Schug |
| 6,260,179 B1 | 7/2001 | Ohsawa et al. |
| 6,262,908 B1 | 7/2001 | Marshall et al. |
| 6,263,430 B1 | 7/2001 | Trimberger et al. |
| 6,266,760 B1 | 7/2001 | DeHon et al. |
| 6,279,077 B1 | 8/2001 | Nasserbakht et al. |
| 6,282,627 B1 | 8/2001 | Wong et al. |
| 6,282,701 B1 | 8/2001 | Wygodny et al. |
| 6,285,624 B1 | 9/2001 | Chen |
| 6,286,134 B1 | 9/2001 | Click, Jr. et al. |
| 6,288,566 B1 | 9/2001 | Hanrahan et al. |
| 6,289,369 B1 | 9/2001 | Sundaresan |
| 6,289,440 B1 | 9/2001 | Casselman |
| 6,298,043 B1 | 10/2001 | Mauger et al. |
| 6,298,396 B1 | 10/2001 | Loyer et al. |
| 6,298,472 B1 | 10/2001 | Phillips et al. |
| 6,301,706 B1 | 10/2001 | Maslennikov et al. |
| 6,311,200 B1 | 10/2001 | Hanrahan et al. |
| 6,311,265 B1 | 10/2001 | Beckerle et al. |
| 6,321,298 B1 | 11/2001 | Hubis |
| 6,321,366 B1 | 11/2001 | Tseng et al. |
| 6,321,373 B1 | 11/2001 | Ekanadham et al. |
| 6,338,106 B1 | 1/2002 | Vorbach et al. |
| 6,339,424 B1 | 1/2002 | Ishikawa et al. |
| 6,339,840 B1 | 1/2002 | Kothari et al. |
| 6,341,318 B1 | 1/2002 | Dakhil |
| 6,347,346 B1 | 2/2002 | Taylor |
| 6,349,346 B1 | 2/2002 | Hanrahan et al. |
| 6,353,841 B1 | 3/2002 | Marshall et al. |
| 6,362,650 B1 | 3/2002 | New et al. |
| 6,370,596 B1 | 4/2002 | Dakhil |
| 6,373,779 B1 | 4/2002 | Pang et al. |
| 6,374,286 B1 | 4/2002 | Gee |
| 6,378,068 B1 | 4/2002 | Foster et al. |
| 6,381,624 B1 | 4/2002 | Colon-Bonet et al. |
| 6,389,379 B1 | 5/2002 | Lin et al. |
| 6,389,579 B1 | 5/2002 | Phillips et al. |
| 6,392,912 B1 | 5/2002 | Hanrahan et al. |
| 6,400,601 B1 | 6/2002 | Sudo et al. |
| 6,404,224 B1 | 6/2002 | Azegami et al. |
| 6,405,185 B1 | 6/2002 | Pechanek et al. |
| 6,405,299 B1 | 6/2002 | Vorbach et al. |
| 6,421,808 B1 | 7/2002 | McGeer |
| 6,421,809 B1 | 7/2002 | Wuytack et al. |
| 6,421,817 B1 | 7/2002 | Mohan et al. |
| 6,425,054 B1 | 7/2002 | Nguyen |
| 6,425,068 B1 | 7/2002 | Vorbach |
| 6,426,649 B1 | 7/2002 | Fu et al. |
| 6,427,156 B1 | 7/2002 | Chapman et al. |
| 6,430,309 B1 | 8/2002 | Pressman et al. |
| 6,434,642 B1 | 8/2002 | Camilleri et al. |
| 6,434,672 B1 | 8/2002 | Gaither |
| 6,434,695 B1 | 8/2002 | Esfahani et al. |

(56) References Cited

U.S. PATENT DOCUMENTS

| | | |
|---|---|---|
| 6,434,699 B1 | 8/2002 | Jones et al. |
| 6,437,441 B1 | 8/2002 | Yamamoto |
| 6,438,747 B1 | 8/2002 | Schreiber et al. |
| 6,449,283 B1 | 9/2002 | Chao et al. |
| 6,456,628 B1 | 9/2002 | Greim et al. |
| 6,457,116 B1 | 9/2002 | Mirsky et al. |
| 6,476,634 B1 | 11/2002 | Bilski |
| 6,477,643 B1 | 11/2002 | Vorbach et al. |
| 6,480,937 B1 | 11/2002 | Vorbach et al. |
| 6,480,954 B2 | 11/2002 | Trimberger et al. |
| 6,483,343 B1 | 11/2002 | Faith et al. |
| 6,487,709 B1 | 11/2002 | Keller et al. |
| 6,490,695 B1 | 12/2002 | Zagorski et al. |
| 6,496,740 B1 | 12/2002 | Robertson et al. |
| 6,496,902 B1 | 12/2002 | Faanes et al. |
| 6,496,971 B1 | 12/2002 | Lesea et al. |
| 6,504,398 B1 | 1/2003 | Lien et al. |
| 6,507,898 B1 | 1/2003 | Gibson et al. |
| 6,507,947 B1 | 1/2003 | Schreiber et al. |
| 6,512,804 B1 | 1/2003 | Johnson et al. |
| 6,513,077 B2 | 1/2003 | Vorbach et al. |
| 6,516,382 B2 | 2/2003 | Manning |
| 6,518,787 B1 | 2/2003 | Allegrucci et al. |
| 6,519,674 B1 | 2/2003 | Lam et al. |
| 6,523,107 B1 | 2/2003 | Stansfield et al. |
| 6,525,678 B1 | 2/2003 | Veenstra et al. |
| 6,526,520 B1 | 2/2003 | Vorbach et al. |
| 6,538,468 B1 | 3/2003 | Moore |
| 6,538,470 B1 | 3/2003 | Langhammer et al. |
| 6,539,415 B1 | 3/2003 | Mercs |
| 6,539,438 B1 | 3/2003 | Ledzius et al. |
| 6,539,477 B1 | 3/2003 | Seawright |
| 6,542,394 B2 | 4/2003 | Marshall et al. |
| 6,542,844 B1 | 4/2003 | Hanna |
| 6,542,998 B1 | 4/2003 | Vorbach |
| 6,553,395 B2 | 4/2003 | Marshall et al. |
| 6,553,479 B2 | 4/2003 | Mirsky et al. |
| 6,567,834 B1 | 5/2003 | Marshall et al. |
| 6,571,381 B1 | 5/2003 | Vorbach et al. |
| 6,587,939 B1 | 7/2003 | Takano |
| 6,598,128 B1 | 7/2003 | Yoshioka et al. |
| 6,606,704 B1 | 8/2003 | Adiletta et al. |
| 6,624,819 B1 | 9/2003 | Lewis |
| 6,625,631 B2 | 9/2003 | Ruehle |
| 6,631,487 B1 | 10/2003 | Abramovici et al. |
| 6,633,181 B1 | 10/2003 | Rupp |
| 6,657,457 B1 | 12/2003 | Hanrahan et al. |
| 6,658,564 B1 | 12/2003 | Smith et al. |
| 6,665,758 B1 | 12/2003 | Frazier et al. |
| 6,665,865 B1 | 12/2003 | Ruf |
| 6,668,237 B1 | 12/2003 | Guccione et al. |
| 6,681,388 B1 | 1/2004 | Sato et al. |
| 6,687,788 B2 | 2/2004 | Vorbach et al. |
| 6,694,434 B1 | 2/2004 | McGee et al. |
| 6,697,979 B1 | 2/2004 | Vorbach et al. |
| 6,704,816 B1 | 3/2004 | Burke |
| 6,708,223 B1 | 3/2004 | Wang et al. |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,725,334 B2 | 4/2004 | Barroso et al. |
| 6,728,871 B1 | 4/2004 | Vorbach et al. |
| 6,745,317 B1 | 6/2004 | Mirsky et al. |
| 6,748,440 B1 | 6/2004 | Lisitsa et al. |
| 6,751,722 B2 | 6/2004 | Mirsky et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,802,026 B1 | 10/2004 | Patterson et al. |
| 6,803,787 B1 | 10/2004 | Wicker, Jr. |
| 6,820,188 B2 | 11/2004 | Stansfield et al. |
| 6,829,697 B1 | 12/2004 | Davis et al. |
| 6,836,842 B1 | 12/2004 | Guccione et al. |
| 6,847,370 B2 | 1/2005 | Baldwin et al. |
| 6,859,869 B1 | 2/2005 | Vorbach |
| 6,868,476 B2 | 3/2005 | Rosenbluth |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,957,306 B2 | 10/2005 | So et al. |
| 6,961,924 B2 | 11/2005 | Bates et al. |
| 6,975,138 B2 | 12/2005 | Pani et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,667 B2 | 3/2006 | Vorbach |
| 7,010,687 B2 | 3/2006 | Ichimura |
| 7,028,107 B2 | 4/2006 | Vorbach et al. |
| 7,036,114 B2 | 4/2006 | McWilliams et al. |
| 7,038,952 B1 | 5/2006 | Zack et al. |
| 7,043,416 B1 | 5/2006 | Lin |
| 7,144,152 B2 | 12/2006 | Rusu et al. |
| 7,155,708 B2 | 12/2006 | Hammes et al. |
| 7,164,422 B1 | 1/2007 | Wholey et al. |
| 7,210,129 B2 | 4/2007 | May et al. |
| 7,216,204 B2 | 5/2007 | Rosenbluth |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,266,725 B2 | 9/2007 | Vorbach et al. |
| 7,340,596 B1 | 3/2008 | Crosland et al. |
| 7,346,644 B1 | 3/2008 | Langhammer et al. |
| 7,350,178 B1 | 3/2008 | Crosland et al. |
| 7,382,156 B2 | 6/2008 | Pani et al. |
| 7,455,450 B2 | 11/2008 | Liu et al. |
| 7,595,659 B2 | 9/2009 | Vorbach et al. |
| 7,650,448 B2 | 1/2010 | Vorbach et al. |
| 7,657,877 B2 | 2/2010 | Vorbach et al. |
| 7,759,968 B1 | 7/2010 | Hussein et al. |
| 7,873,811 B1 | 1/2011 | Wolinski et al. |
| 7,971,051 B2 | 6/2011 | Paul et al. |
| 2001/0001860 A1 | 5/2001 | Bieu |
| 2001/0003834 A1 | 6/2001 | Shimonishi |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0004916 A1 | 1/2002 | Marchand et al. |
| 2002/0010853 A1 | 1/2002 | Trimberger et al. |
| 2002/0013861 A1 | 1/2002 | Adiletta et al. |
| 2002/0038414 A1 | 3/2002 | Taylor |
| 2002/0045952 A1 | 4/2002 | Blemel |
| 2002/0051482 A1 | 5/2002 | Lomp |
| 2002/0073282 A1 | 6/2002 | Chauvel et al. |
| 2002/0083308 A1 | 6/2002 | Pereira et al. |
| 2002/0099759 A1 | 7/2002 | Gootherts |
| 2002/0103839 A1 | 8/2002 | Ozawa |
| 2002/0124238 A1 | 9/2002 | Metzgen |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0147932 A1 | 10/2002 | Brock et al. |
| 2002/0152060 A1 | 10/2002 | Tseng |
| 2002/0156962 A1 | 10/2002 | Chopra et al. |
| 2002/0162097 A1 | 10/2002 | Meribout |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | May et al. |
| 2003/0052711 A1 | 3/2003 | Taylor |
| 2003/0055861 A1 | 3/2003 | Lai et al. |
| 2003/0056062 A1 | 3/2003 | Prabhu |
| 2003/0056085 A1 | 3/2003 | Vorbach |
| 2003/0056091 A1 | 3/2003 | Greenberg |
| 2003/0056202 A1 | 3/2003 | May et al. |
| 2003/0061542 A1 | 3/2003 | Bates et al. |
| 2003/0062922 A1 | 4/2003 | Douglass et al. |
| 2003/0070059 A1 | 4/2003 | Dally et al. |
| 2003/0086300 A1 | 5/2003 | Noyes et al. |
| 2003/0093662 A1 | 5/2003 | Vorbach et al. |
| 2003/0097513 A1 | 5/2003 | Vorbach et al. |

(56) References Cited

U.S. PATENT DOCUMENTS

| | | |
|---|---|---|
| 2003/0123579 A1 | 7/2003 | Safavi et al. |
| 2003/0135686 A1 | 7/2003 | Vorbach et al. |
| 2003/0154349 A1 | 8/2003 | Berg et al. |
| 2003/0192032 A1 | 10/2003 | Andrade et al. |
| 2003/0226056 A1 | 12/2003 | Yip et al. |
| 2004/0015899 A1 | 1/2004 | May et al. |
| 2004/0025005 A1 | 2/2004 | Vorbach et al. |
| 2004/0039880 A1 | 2/2004 | Pentkovski et al. |
| 2004/0078548 A1 | 4/2004 | Claydon et al. |
| 2004/0088689 A1 | 5/2004 | Hammes |
| 2004/0088691 A1 | 5/2004 | Hammes et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0091468 A1 | 4/2005 | Morita et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |
| 2006/0036988 A1 | 2/2006 | Allen et al. |
| 2006/0095716 A1 | 5/2006 | Ramesh |
| 2006/0230094 A1 | 10/2006 | Simkins et al. |
| 2006/0230096 A1 | 10/2006 | Thendean et al. |
| 2007/0050603 A1 | 3/2007 | Vorbach et al. |
| 2007/0083730 A1 | 4/2007 | Vorbach et al. |
| 2007/0143577 A1 | 6/2007 | Smith |
| 2008/0313383 A1 | 12/2008 | Morita et al. |
| 2009/0079466 A1* | 3/2009 | Mitra et al. ............ 326/37 |
| 2009/0085603 A1 | 4/2009 | Paul et al. |
| 2009/0193384 A1 | 7/2009 | Sima et al. |
| 2010/0306602 A1 | 12/2010 | Kamiya et al. |
| 2012/0176155 A1* | 7/2012 | Weber et al. ............ 326/38 |

FOREIGN PATENT DOCUMENTS

| | | |
|---|---|---|
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 638 867 A2 | 8/1994 |
| EP | 0 628 917 | 12/1994 |
| EP | 0 678 985 | 10/1995 |
| EP | 0 686 915 | 12/1995 |
| EP | 0 696 001 | 2/1996 |
| EP | 0 707 269 | 4/1996 |
| EP | 0 726 532 | 8/1996 |
| EP | 0 735 685 | 10/1996 |
| EP | 0 746 106 | 12/1996 |
| EP | 0 748 051 | 12/1996 |
| EP | 0 926 594 | 6/1999 |
| EP | 1 061 439 | 12/2000 |
| EP | 1 115 204 | 7/2001 |
| EP | 1 146 432 | 10/2001 |
| EP | 1 669 885 | 6/2006 |
| FR | 2 752 466 | 2/1998 |
| GB | 2 304 438 | 3/1997 |
| JP | 58-058672 | 4/1983 |
| JP | 1044571 | 2/1989 |
| JP | 1-229378 | 9/1989 |
| JP | 2-130023 | 5/1990 |
| JP | 2-226423 | 9/1990 |
| JP | 5-265705 | 10/1993 |
| JP | 5-276007 | 10/1993 |
| JP | 5-509184 | 12/1993 |
| JP | 6-266605 | 9/1994 |
| JP | 7-086921 | 3/1995 |
| JP | 7-154242 | 6/1995 |
| JP | 8-148989 | 6/1995 |
| JP | 7-182160 | 7/1995 |
| JP | 7-182167 | 7/1995 |
| JP | 8-044581 | 2/1996 |
| JP | 8-069447 | 3/1996 |
| JP | 8-101761 | 4/1996 |
| JP | 8-102492 | 4/1996 |
| JP | 8-106443 | 4/1996 |
| JP | 8-221164 | 8/1996 |
| JP | 8-250685 | 9/1996 |
| JP | 9-027745 | 1/1997 |
| JP | 9-237284 | 9/1997 |
| JP | 9-294069 | 11/1997 |
| JP | 11-046187 | 2/1999 |
| JP | 11-184718 | 7/1999 |
| JP | 11-307725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| JP | 2001-167066 | 6/2001 |
| JP | 2001-510650 | 7/2001 |
| JP | 2001-236221 | 8/2001 |
| JP | 2002-0033457 | 1/2002 |
| JP | 3-961028 | 8/2007 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO/95/25306 A2 | 9/1995 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | WO00/45282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/036507 | 5/2003 |
| WO | WO 03/091875 | 11/2003 |

(56) References Cited

FOREIGN PATENT DOCUMENTS

| WO | WO2004/053718 | 6/2004 |
|---|---|---|
| WO | WO2004/114128 | 12/2004 |
| WO | WO2005/045692 | 5/2005 |
| WO | WO 2007/030395 | 3/2007 |

OTHER PUBLICATIONS

Almasi and Gottlieb, *Highly Parallel Computing*, The Benjamin/Cummings Publishing Company, Inc., Redwood City, CA, 1989, 3 pages (Fig. 4.1).
Advanced RISC Machines Ltd (ARM), "AMBA—Advanced Microcontroller Bus Architecture Specification," (Document No. ARM IHI 0001C), Sep. 1995, 72 pages.
Alfke, Peter; New, Bernie, *Xilinx Application Note*, "Additional XC3000 Data," XAPP 024.000, 1994, pp. 8-11 through 8-20.
Alfke, Peter; New, Bernie, *Xilinx Application Note*, "Adders, Subtracters and Accumulators in XC3000," XAPP 022.000, 1994, pp. 8-98 through 8-104.
Alfke, Peter, *Xilinx Application Note*, "Megabit FIFO in Two Chips: One LCA Device and One DRAM," XAPP 030.000, 1994, pp. 8-148 through 8-150.
Alfke, Peter, *Xilinx Application Note*, "Dynamic Reconfiguration," XAPP 093, Nov. 10, 1997, pp. 13-45 through 13-46.
Alfke, Peter; New, Bernie, *Xilinx Application Note*, "Implementing State Machines in LCA Devices," XAPP 027.001, 1994, pp. 8-169 through 8-172.
Algotronix, Ltd., CAL64K Preliminary Data Sheet, Apr. 1989, pp. 1-24.
Algotronix, Ltd., CAL4096 Datasheet, 1992, pp. 1-53.
Algotronix, Ltd., CHS2×4 User Manual, "CHA2×4 Custom Computer," 1991, pp. 1-38.
Allaire, Bill; Fischer, Bud, *Xilinx Application Note*, "Block Adaptive Filter," XAPP 055, Aug. 15, 1996 (Version 1.0), pp. 1-10.
Altera Application Note (73), "Implementing FIR Filters in FLEX Devices," Altera Corporation, Feb. 1998, ver. 1.01, pp. 1-23.
Athanas, P. (Thesis), "An adaptive machine architecture and compiler for dynamic processor reconfiguration," Brown University 1992, pp. 1-157.
Berkeley Design Technology, Inc., *Buyer's Guide to DSP Processors*, 1995, Fremont, CA., pp. 673-698.
Bittner, R. et al., "Colt: An Experiment in Wormhole Run-Time Reconfiguration," Bradley Department of Electrical and Computer Engineering, Blacksburg, VA, SPIE—International Society for Optical Engineering, vol. 2914/187, Nov. 1996, Boston, MA, pp. 187-194.
Camilleri, Nick; Lockhard, Chris, *Xilinx Application Note*, "Improving XC4000 Design Performance," XAPP 043.000, 1994, pp. 8-21 through 8-35.
Cartier, Lois, *Xilinx Application Note*, "System Design with New XC4000EX I/O Features," Feb. 21, 1996, pp. 1-8.
Chen, D., (Thesis) "Programmable arithmetic devices for high speed digital signal processing," U. California Berkeley 1992, pp. 1-175.
Churcher, S., et al., "The XC6200 FastMapTM Processor Interface," Xilinx, Inc., Aug. 1995, pp. 1-8.
Cowie, Beth, *Xilinx Application Note*, "High Performance, Low Area, Interpolator Design for the XC6200," XAPP 081, May 7, 1997 (Version 1.0), pp. 1-10.
Duncan, Ann, *Xilinx Application Note*, "A32xx16 Reconfigurable Correlator for the XC6200," XAPP 084, Jul. 25, 1997 (Version 1.0), pp. 1-14.
Ebeling, C., et al., "RaPiD—Reconfigurable Pipelined Datapath," Dept. of Computer Science and Engineering, U. Washington, 1996, pp. 126-135.
Epstein, D., "IBM Extends DSP Performance with Mfast—Powerful Chip Uses Mesh Architecture to Accelerate Graphics, Video," 1995 MicroDesign Resources, vol. 9, No. 16, Dec. 4, 1995, pp. 231-236.
Fawcett, B., "New SRAM-Based FPGA Architectures Address New Applications," Xilinx, Inc. San Jose, CA, Nov. 1995, pp. 231-236.

Goslin, G; Newgard, B, *Xilinx Application Note*, "16-Tap, 8-Bit FIR Filter Applications Guide," Nov. 21, 1994, pp. 1-5.
Iwanczuk, Roman, *Xilinx Application Note*, "Using the XC4000 RAM Capability," XAPP 031.000, 1994, pp. 8-127 through 8-138.
Knapp, Steven, "Using Programmable Logic to Accelerate DSP Functions," Xilinx, Inc., 1995, pp. 1-8.
New, Bernie, *Xilinx Application Note*, "Accelerating Loadable Counters in SC4000," XAPP 023.001, 1994, pp. 8-82 through 8-85.
New, Bernie, *Xilinx Application Note*, "Boundary Scan Emulator for XC3000," XAPP 007.001, 1994, pp. 8-53 through 8-59.
New, Bernie, *Xilinx Application Note*, "Ultra-Fast Synchronous Counters," XAPP 014.001, 1994, pp. 8-78 through 8-81.
New, Bernie, *Xilinx Application Note*, "Using the Dedicated Carry Logic in XC4000," XAPP 013.001, 1994, pp. 8-105 through 8-115.
New, Bernie, *Xilinx Application Note*, "Complex Digital Waveform Generator," XAPP 008.002, 1994, pp. 8-163 through 8-164.
New, Bernie, *Xilinx Application Note*, "Bus-Structured Serial Input-Output Device," XAPP 010.001, 1994, pp. 8-181 through 8-182.
Ridgeway, David, *Xilinx Application Note*, "Designing Complex 2-Dimensional Convolution Filters," XAPP 037.000, 1994, pp. 8-175 through 8-177.
Rowson, J., et al., "Second-generation compilers optimize semicustom circuits," Electronic Design, Feb. 19, 1987, pp. 92-96.
Schewel, J., "A Hardware/Software Co-Design System using Configurable Computing Technology," Virtual Computer Corporation, Reseda, CA, IEEE 1998, pp. 620-625.
Segers, Dennis, Xilinx Memorandum, "MIKE—Product Description and MRD," Jun. 8, 1994, pp. 1-29.
Texas Instruments, "TMS320C8x System-Level Synopsis," Sep. 1995, 75 pages.
Texas Instruments, "TMS320C80 Digital Signal Processor," Data Sheet, Digital Signal Processing Solutions 1997, 171 pages.
Texas Instruments, "TMS320C80 (MVP) Parallel Processor," User's Guide, Digital Signal Processing Products 1995, 73 pages.
Trainor, D.W., et al., "Implementation of the 2D DCT Using a Xilinx XC6264 FPGA," 1997, IEEE Workshop of Signal Processing Systems SiPS 97, pp. 541-550.
Trimberger, S, (Ed.) et al., "Field-Programmable Gate Array Technology," 1994, Kluwer Academic Press, pp. 1-258 (and the Title Page, Table of Contents, and Preface) [274 pages total].
Trimberger, S., "A Reprogrammable Gate Array and Applications," IEEE 1993, Proceedings of the IEEE, vol. 81, No. 7, Jul. 1993, pp. 1030-1041.
Trimberger, S., et al., "A Time-Multiplexed FPGA," Xilinx, Inc., 1997 IEEE, pp. 22-28.
Ujvari, Dan, *Xilinx Application Note*, "Digital Mixer in an XC7272," XAPP 035.002, 1994, p. 1.
Veendrick, H., et al., "A 1.5 GIPS video signal processor (VSP)," Philips Research Laboratories, The Netherlands, IEEE 1994 Custom Integrated Circuits Conference, pp. 95-98.
Wilkie, Bill, *Xilinx Application Note*, "Interfacing XC6200 to Microprocessors (TMS320C50 Example)," XAPP 064, Oct. 9, 1996 (Version 1.1), pp. 1-9.
Wilkie, Bill, *Xilinx Application Note*, "Interfacing XC6200 to Microprocessors (MC68020 Example)," XAPP 063, Oct. 9, 1996 (Version 1.1), pp. 1-8.
XCELL, Issue 18, Third Quarter 1995, "Introducing three new FPGA Families!"; "Introducing the XC6200 FPGA Architecture: The First FPGA Architecture Optimized for Coprocessing in Embedded System Applications," 40 pages.
*Xilinx Application Note*, Advanced Product Specification, "XC6200 Field Programmable Gate Arrays," Jun. 1, 1996 (Version 1.0), pp. 4-253-4-286.
*Xilinx Application Note*, "A Fast Constant Coefficient Multiplier for the XC6200," XAPP 082, Aug. 24, 1997 (Version 1.0), pp. 1-5.
Xilinx Technical Data, "XC5200 Logic Cell Array Family," Preliminary (v1.0), Apr. 1995, pp. 1-43.
Xilinx Data Book, "The Programmable Logic Data Book," 1996, 909 pages.
Xilinx, Series 6000 User's Guide, Jun. 26, 1997, 223 pages.
Yeung, K., (Thesis) "A Data-Driven Multiprocessor Architecture for High Throughput Digital Signal Processing," Electronics Research Laboratory, U. California Berkeley, Jul. 10, 1995, pp. 1-153.

(56) References Cited

OTHER PUBLICATIONS

Yeung, L., et al., "A 2.4GOPS Data-Driven Reconfigurable Multiprocessor IC for DSP," Dept. of EECS, U. California Berkeley, 1995 IEEE International Solid State Circuits Conference, pp. 108-110.
ZILOG Preliminary Product Specification, "Z86C95 CMOS Z8 Digital Signal Processor," 1992, pp. 1-82.
ZILOG Preliminary Product Specification, "Z89120 Z89920 (ROMless) 16-Bit Mixed Signal Processor," 1992, pp. 1-82.
Defendants' Invalidity Contentions in *PACT XPP Technologies, AG v. Xilinx, Inc., et al.*, (E.D. Texas Dec. 28, 2007) (No. 2:07cv563), including Exhibits A through K in separate PDF files.
Microsoft Press Computer Dictionary, Third Edition, Redmond, WA, 1997, 3 pages.
Microsoft Press Computer Dictionary, Second Edition, Redmond, WA, 1994, 3 pages.
A Dictionary of Computing, Fourth Edition, Oxford University Press, 1997, 4 pages.
Communications Standard Dictionary, Third Edition, Martin Weik (Ed.), Chapman & Hall, 1996, 3 pages.
Dictionary of Communications Technology, Terms Definitions and Abbreviations, Second Edition, Gilbert Held (Ed.), John Wiley & Sons, England, 1995, 5 pages.
The Random House College Dictionary, Revised Edition, Random House, Inc. 1984, 14 pages.
The Random House College Dictionary, Revised Edition, Random House, Inc., 1984, 7 pages.
Random House Webster's College Dictionary with CD-ROM, Random House, 2001, 7 pages.
Random House Webster's College Dictionary with CD-ROM, Random House, 2001, 4 pages.
Random House Personal Computer Dictionary, Second Edition, Philip E. Margolis (Ed.), Random House, New York, 1996, 5 pages.
The IEEE Standard Dictionary of Electrical and Electronics Terms, Sixth Edition, 1996, 36 pages.
The IEEE Standard Dictionary of Electrical and Electronics Terms, Sixth Edition, 1996, 8 pages.
McGraw-Hill Electronics Dictionary, Sixth Edition, Neil Sclater et al. (Ed.), McGraw-Hill, 1997, 3 pages.
Modern Dictionary of Electronics, Sixth Edition., Rudolf Graf (Ed.), Newnes (Butterwoth-Heinemann), 1997, 5 pages.
The American Heritage Dictionary, Fourth Edition, Dell (Houghton-Mifflin), 2001, 5 pages.
The American Heritage Dictionary, Second College Edition, Houghton Mifflin, 1982, 23 pages.
The American Heritage Dictionary, Second College Edition, Houghton Mifflin, 1982, 8 pages.
The American Heritage Dictionary, Third Edition, Dell Publishing (Bantam Doubleday Dell Publishing Group, Inc.), 1994, 4 pages.
The American Heritage Dictionary, Fourth Edition, Dell/Houghton Mifflin 2001, 5 pages.
Webster's New Collegiate Dictionary, Merriam Co., 1981, 5 pages.
Webster's New Collegiate Dictionary, Merriam Co., 1981, 4 pages.
The Oxford American Dictionary and Language Guide, Oxford University Press, 1999, 5 pages.
The Oxford Duden German Dictionary, Edited by the Dudenredaktion and the German Section of the Oxford University Press, W. Scholze-Stubenrecht et al. (Eds), Clarendon Press, Oxford, 1990, 7 pages.
Oxford Dictionary of Computing, Oxford University Press, 2008, 4 pages.
Modern Dictionary of Electronics, Sixth Edition Revised and Updated, Rudolf F. Graf (Ed.), Butterworth-Heinemann, 1997, 7 pages.
Modern Dictionary of Electronics, Sixth Edition Revised and Updated, Rudolf F. Graf (Ed.), Butterworth-Heinemann, 1997, 5 pages.
Garner's Modern American Usage, Bryan A. Garner (Ed.), Oxford University Press, 2003, 3 pages.
The New Fowler's Modern English Usage, R.W. Burchfield (Ed.), Oxford University Press, 2000, 3 pages.

Wikipedia, the free encyclopedia, "Granularity," at http://en.wikipedia.org/wiki/Granularity, Jun. 18, 2010, 4 pages.
Wordsmyth, The Premier Educational Dictionary—Thesaurus, at http://www.wordsmyth.net, "communication," Jun. 18, 2010, 1 page.
Yahoo! Education, "affect," at http://education.yahoo.com/reference/dictionary/entry/affect, Jun. 18, 2010, 2 pages.
mPulse Living Language, "high-level," at http://www.macmillandictionary.com/dictionary/american/high-level, Jun. 18, 2010, 1 page.
MSN Encarta, "regroup," at http://encarta.msn.com/encnet/features/dictionary/DictionaryResults.aspx?lextype=3&search=regroup, Jun. 17, 2010, 2 pages.
MSN Encarta, "synchronize," at http://encarta.msn.com/encnet/features/dictionary/DictionaryResults.aspx?lextype=3 &search=synchronize, Jun. 17, 2010, 2 pages.
MSN Encarta, "pattern," at http://encarta.msn.com/encnet/features/dictionary/DictionaryResults.aspx?lextype=&search=pattern, Jun. 17, 2010, 2 pages.
MSN Encarta, "dimension," at http://encarta.msn.com/encnet/features/dictionary/DictionaryResults.aspx?lextype=3&search=dimension, Jun. 17, 2010, 2 pages.
MSN Encarta, "communication," at http://encarta.msn.com/encnet/features/dictionary/DictionaryResults.aspx?lextype=3&search=communication, Jun. 17, 2010, 2 pages.
MSN Encarta, "arrangement," at http://encarta.msn.com/encnet/features/dictionary/DictionaryResults.aspx?lextype=3&search=arrangement, Jun. 17, 2010, 2 pages.
MSN Encarta, "vector," at http://encarta.msn.com/encnet/features/dictionary/DictionaryResults.aspx?lextype=3&search=vector, Jul. 30, 2010, 2 pages.
Dictionary.com, "address," at http://dictionary.reference.com/browse/address, Jun. 18, 2010, 4 pages.
P.R. 4-3 Joint Claim Constructions Statement, *PACT XPP Technologies, AG v. Xilinx, Inc. and Avnet, Inc. et al.*, E.D. Texas, 2.07-cv-00563-CE, Jul. 19, 2010, pp. 1-50.
Order Granting Joint Motion for Leave to File an Amended Joint Claim Construction and Prehearing Statement and Joint Motion to File an Amended Joint Claim Construction and Prehearing Statement Pursuant to Local Patent Rule 4-3, and Exhibit A: P.R. 4-3 Amended Joint Claim Constructions Statement, *PACT XPP Technologies, AG v. Xilinx, Inc. and Avnet, Inc. et al.*, E.D. Texas, 2:07-cv-00563-CE, Aug. 2, 2010, 72 pages.
P.R. 4-3 Amended Joint Claim Constructions Statement, *PACT XPP Technologies, AG v. Xilinx, Inc. and Avnet, Inc. et al.*, E.D. Texas, 2:07-cv-00563-CE, Aug. 3, 2010, pp. 1-65.
Exhibit A—P.R. 4-3 Amended Joint Claim Constructions Statement, *PACT XPP Technologies, AG v. Xilinx Inc. and Avnet, Inc. et al.*, E.D. Texas, 2:07-cv-00563-CE, Aug. 2, 2010, pp. 1-66.
PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-55.
Declaration of Harry L. (Nick) Tredennick in Support of PACT's Claim Constructions, *PACT XPP Technologies, AG v. Xilinx, Inc. and Avnet, Inc. et al.*, E.D. Texas, 2:07-cv-00563-CE, Nov. 1, 2010, pp. 1-87.
Transcript of Harry (Nick) L. Tredennick III, Ph.D., Oct. 11, 2010, vol. 1, Exhibit 16 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-3.
Agreed and Disputed Terms, Exhibit 17 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-16.
Oral Videotaped Deposition—Joseph McAlexander dated Oct. 12, 2010, vol. 1, Exhibit 18 of PACT's Opening Claim Construction Brief, *PACT XPP Technologies, AG v. Xilinx, Inc. and Avnet, Inc. et al.*, E.D. Texas, 2;07-cv-00563-CE, Nov. 1, 2010, pp. 1-17.
Expert Report of Joe McAlexander Re Claim Construction dated Sep. 27, 2010, Exhibit 19 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-112.
Documents from File History of U.S. Appl. No. 09/290,342, filed Apr. 12, 1999, Exhibit 20 of PACT's Opening Claim Construction

(56) References Cited

OTHER PUBLICATIONS

Brief; *PACT XPP Technologies, AG v. Xilinx, Inc. and Avnet, Inc. et al.*, E.D. Texas, 2:07-cv-00563-CE, Nov. 1, 2010, pp. 1-37.
Amendment from File History of U.S. Appl. No. 10/156,397, filed May 28, 2002, Exhibit 25 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.
Documents from File History U.S. Appl. No. 09/329,132, filed Jun. 9, 1999, Exhibit 27 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-36.
Amendment from File History of U.S. Appl. No. 10/791,501, filed Mar. 1, 2004, Exhibit 39 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-9.
Amendment from File History of U.S. Appl. No. 10/265,846, filed Oct. 7, 2002, Exhibit 40 of PACT's Opening Claim Construction Brief, *PACT XPP Technologies, AG v. Xilinx, Inc. and Avnet, Inc. et al.*, E.D. Texas, 2:07-cv-00563-CE, Nov. 1, 2010, pp. 1-12.
Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-55.
Declaration of Aaron Taggart in Support of Defendants Xilinx, Inc. and Avnet, Inc.'s Responsive Claim Construction Brief; Defendants Xilinx, Inc. and Avnet, Inc.'s Responsive Claim Construction Brief (Exhibit A), *PACT XPP Technologies, AG v. Xilinx, Inc. and Avnet, Inc. et al.*, E.D. Texas, 2:07-cv-00563-CE, Dec. 6, 2010, pp. 1-5.
Oral Videotaped Deposition Joseph McAlexander (Oct. 12, 2010), Exhibit I of of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-9.
Expert Report of Joe McAlexander re Claim Construction, Exhibit 2 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.
Documents from File History of U.S. Appl. No. 09/290,342, filed Apr. 12, 1999, Exhibit 6 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv00563-CE, Dec. 6, 2010, pp. 1-181.
Transcript of Harry (Nick) L. Tredennick III, Ph.D., Oct. 11, 2010, vol. I, Exhibit 7 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-28.
Amendment, Response from File History of U.S. Appl. No. 10/156,397, filed May 28, 2002, Exhibit 15 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-137.
Application from File History of U.S. Appl. No. 08/544,435, filed Nov. 17, 1995, Exhibit 20 of Defendants Xilinx, Inc. and Avnet, Inc.'s Responsive Claim Construction Brief, *PACT XPP Technologies, AG v. Xilinx, Inc. and Avnet, Inc, et al.*, E.D. Texas, 2:07-cv-00563-CE, Dec. 6, 2010, pp. 1-102.
Documents from File History of U.S. Appl. No. 09/329,132, filed Jun. 9, 1999, Exhibit 24 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-13.
Documents from File History of U.S. Appl. No. 10/791,501, filed Mar. 1, 2004, Exhibit 25 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-14.
Amendment from File History of U.S. Appl. No. 11/246,617, filed Oct. 7, 2005, Exhibit 26 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-9.
Documents from File History of U.S. Appl. No. 08/947,254, filed Oct. 8, 1997, Exhibit 27 of Defendants Xilinx, Inc. and Avnet, Inc.'s Responsive Claim Construction Brief; *PACT XPP Technologies, AG v. Xilinx, Inc. and Avnet, Inc. et al.*, E.D. Texas, 2:07-cv-00563-CE, Dec. 6, 2010, pp. 1-38.
Documents from File History of U.S. Appl. No. 08/947,254, filed Oct. 8, 1997, specifically, German priority application specification [English translation provided], Exhibit 33 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, 54 pages [including English translation].
Documents from File History of U.S. Appl. No. 09/335,974, filed Jun. 18, 1999, Exhibit 28 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-32.
Documents from File History of U.S. Patent Reexamination Control No. 90/010,450, filed Mar. 27, 2009, Exhibit 30 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-71.
Documents from File History of U.S. Appl. No. 10/265,846, filed Oct. 7, 2002, Exhibit 32 of Defendants Xilinx, Inc. and Avnet, Inc.'s Responsive Claim Construction Brief, *PACT XPP Technologies, AG v. Xilinx, Inc. and Avnet, Inc. et al.*, E.D. Texas, 2:07-cv-00563-CE, Dec. 6, 2010, pp. 1-23.
PACT's Claim Construction Reply Brief, *PACT XPP Technologies, AG v. Xilinx, Inc. and Avnet, Inc. et al.*, E.D. Texas, 2:07-cv-00563-CE, Jan. 7, 2011, pp. 1-20.
Defendants Xilinx, Inc. and Avnet, Inc.'s Claim Construction Surreply Brief, *PACT XPP Technologies, AG v. Xilinx, Inc. and Avnet, Inc. et al.*, E.D. Texas, 2:07-cv-00563-CE, Jan. 18, 2011, 142 pages.
Markman Hearing Minutes and Attorney Sign-In Sheet, *PACT XPP Technologies, AG v. Xilinx, Inc. and Avnet, Inc. et al.*, E.D. Texas, 2:07-cv-00563-CE, Feb. 22, 2011, 3 pages; and court transcript, 245 pages.
Memorandum Opinion and Order, *PACT XPP Technologies, AG v. Xilinx, Inc. and Avnet, Inc. et al.*, E.D. Texas, 2:07-cv-00563-CE, Jun. 17, 2011, pp. 1-71.
Atmel Corporation, Atmel 5-K-50K Gates Coprocessor FPGA and FreeRAM, (www.atmel.com), Apr. 2002, pp. 1-68.
Glaskowsky, Peter N., "PACT Debuts Extreme Processor; Reconfigurable ALU Array Is Very Powerful—and Very Complex," The Insider's Guide to Microprocessor Hardware, MicroDesign Resources—Micoprocessor Report, Oct. 9, 2000 (www.MPRonline.com), 6 pages.
Glaskowsky, Peter N., "Analysis' Choice Nominees Named; Our Picks for 2002's Most Important Products and Technologies," The Insider's Guide to Microprocessor Hardware, MicroDesign Resources—Micoprocessor Report, Dec. 9, 2002 (www.MPRonline.com), 4 pages.
Lattice Semiconductor Corporation, "ispLSI 2000E, 2000VE and 2000 VL Family Architectural Description," Oct. 2001, pp. 1-88.
Olukotun, K. et al., "Rationale, Design and Performance of the Hydra Multiprocessor," Computer Systems Laboratory, Stanford University, CA, Nov. 1994, pp. 1-19.
PACT Corporate Backgrounder, PACT company release, Oct. 2008, 4 pages.
Page, Ian., "Reconfigurable processor architectures," Oxford University Computing Laboratory, Oxford UK, Elsevier Science B.V., Microprocessors and Microsystems 20 (1996) pp. 185-196.
Singh, Hartej et al., "Morpho-Sys: A Reconfigurable Architecture for Multimedia Applications," Univ. of California, Irvine, CA and Federal University of Rio de Janiero, Brazil, IEEE Transactions on Computers, Circuit Design 1998 at http://www.eng.uci.edu/morphosys/docs/sbcci98.html, 10 pages.
Theodoridis, G. et al., "Chapter 2—A Survey of Coarse-Grain Reconfigurable Architectures and Cad Tools, Basic Definitions, Critical Design Issues and Existing Coarse-grain Reconfigurable

(56) References Cited

OTHER PUBLICATIONS

Systems," from S. Vassiliadis, and D. Soudris (eds.) *Fine- and Coarse-Grained Rerconfigurable Computing*, Springer 2007, pp. 89-149.
Weinhardt, Markus et al., "Using Function Folding to Improve Silicon Efficiency of Reconfigurable Arithmetic Arrays," PACT XPP Technologies AG, Munich, Germany, IEEE 2004, pp. 239-245.
Xilinx, XC6200 Field Programmable Gate Arrays, Advance Product Specification, Jun. 1, 1996 (Version 1.0), pp. 4-255 through 4-286.
Xilinx, Virtex-II Platform FPGA User Guide, UG002 (V2.1) Mar. 28, 2007, pp. 1-502 [Parts 1-3].
(86) Xilinx, XC4000E and SC4000X Serial Field Programmable Gate Arrays, Product Specification (Version 1.6), May 14, 1999, pp. 1-107.
Reexam U.S. Appl. No. 90/010,979, Vorbach et al., filed May 4, 2010.
Reexam U.S. Appl. No. 90/011,087, Vorbach et al., filed Jul. 8, 2010.
Reexam U.S. Appl. No. 90/010,450, Vorbach et al., filed Mar. 27, 2009.
U.S. Appl. No. 60/109,417, Jefferson et al., filed Nov. 18, 1998.
Abnous et al., "Ultra-Low-Power Domain-Specific Multimedia Processors," U.C. Berkeley, 1996 IEEE, pp. 461-470.
Abnous, A., et al., "The Pleiades Architecture," Chapter I of *The Application of Programmable DSPs in Mobile Communications*, A. Gatherer and A. Auslander, Ed., Wiley, 2002, pp. 1-33.
Ade, et al., "Minimum Memory Buffers in DSP Applications," Electronics Letters, vol. 30, No. 6, Mar. 17, 1994, pp. 469-471.
Advanced RISC Machines, "Introduction to AMBA," Oct. 1996, Section 1, pp. 1-7.
ARM, "The Architecture for the Digital World," http://www.arm.com/products/ Mar. 18, 2009, 3 pages.
ARM, "The Architecture for the Digital World; Milestones," http://www.arm.com/aboutarm/milestones.html Mar. 18, 2009, 5 pages.
ARM Limited, "ARM Architecture Reference Manual," Dec. 6, 2000, pp. A10-6-A10-7.
Albaharna, O.T. et al., "On the Viability of FPGA-Based Integrated Coprocessors," Dept. of Electrical and Electronic Engineering, Imperial College of Science, London, 1999 IEEE, pp. 206-215.
Alippi, et al., "Determining the Optimum Extended Instruction Set Architecture for Application Specific Reconfigurable VLIW CPUs," IEEE, 2001, pp. 50-56.
Altera, "Implementing High-Speed Search Applications with Altera CAM," Jul. 2001, Ver. 2.1, Application Note 119, 50 pages.
Altera, "Flex 8000 Programmable Logic Device Family," Altera Corporation Data Sheet, Jan. 2003, pp. 1-62.
Altera, "Flex 10K Embedded Programmable Logic Device Family," Altera Corporation Data Sheet, Jan. 2003, pp. 1-128.
Altera, "APEX 20K Programmable Logic Device Family," Altera Corporation Data Sheet, Mar. 2004, ver. 5.1, pp. 1-117.
Altera, "2. TriMatrix Embedded Memory Blocks in Stratix & Stratix GX Devices," Altera Corporation, Jul. 2005, 28 pages.
Altera, "APEX II Programmable Logic Device Family," Altera Corporation Data Sheet, Aug. 2002, Ver. 3.0, 99 pages.
Arabi, et al., "PLD Integrates Dedicated High-speed Data Buffering, Complex State machine, and Fast Decode Array," conference record on WESCON '93, Sep. 28, 1993, pp. 432-436.
Asari, K. et al., "FeRAM circuit technology for system on a chip," *Proceedings First NASA/DoD Workshop on Evolvable Hardware* (1999), pp. 193-197.
Athanas, "A Functional Reconfigurable Architecture and Compiler for Adoptive Computing," IEEE 1993, pp. 49-55.
Athanas, et al., "An Adaptive Hardware Machine Architecture and Compiler for Dynamic Processor Reconfigugation," IEEE, Laboratory for Engineering man/Machine Systems Division of Engineering, Box D, Brown University, Providence, Rhode Island, 1991, pp. 397-400.
Athanas et al., "Processor Reconfiguration Through Instruction-Set Metamorphosis," 1993, IEEE Computers, pp. 11-18.
Atmel, 5-K-50K Gates Coprocessor FPGA with Free Ram, Data Sheet, Jul. 2006, 55 pages.
Atmel, FPGA-based FIR Filter Application Note, Sep. 1999, 10 pages.
Atmel, "An Introduction to DSP Applications using the AT40K FPGA," FPGA Application Engineering, San Jose, CA, Apr. 2004, 15 pages.
Atmel, Configurable Logic Design & Application Book, Atmel Corporation, 1995, pp. 2-19 through 2-25.
Atmel, Field Programmable Gate Array Configuration Guide, AT6000 Series Configuration Data Sheet, Sep. 1999, pp. 1-20.
Bacon, D. et al., "Compiler Transformations for High-Performance Computing," ACM Computing Surveys, 26(4):325-420 (1994).
Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.
Ballagh et al., "Java Debug Hardware Models Using JBits," 8th Reconfigurable Architectures Workshop, 2001, 8 pages.
Baumgarte, V. et al., "PACT XPP—A Self-reconfigurable Data Processing Architecture," PACT Info. GMBH, Munchen Germany, 2001, 7 pages.
Beck et al., "From control flow to data flow," TR 89-1050, Oct. 1989, Dept. of Computer Science, Cornell University, Ithaca, NY, pp. 1-25.
Becker, J., "A Partitioning Compiler for Computers with Xputer-based Accelerators," 1997, Kaiserslautern University, 326 pp.
Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003), 6 pages.
Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002), 6 pages.
Becker et al., "Automatic Parallelism Exploitation for FPL-Based Accelerators," 1998, Proc. 31st Annual Hawaii International Conference on System Sciences, pp. 169-178.
Becker, J. et al., "Parallelization in Co-compilation for Configurable Accelerators—a Host/accelerator Partitioning Compilation Method," Proceedings of Asia and South Pacific Design Automation Conference, Yokohama, Japan, Feb. 10-13, 1998, 11 pages.
Bellows et al., "Designing Run-Time Reconfigurable Systems with JHDL," Journal of VLSI Signal Processing 28, Kluwer Academic Publishers, The Netherlands, 2001, pp. 29-45.
Bittner, "Wormhole Run-time Reconfiguration: Conceptualization and VLSI Design of a High Performance Computing System," *Dissertation*, Jan. 23, 1997, pp. I-XX, 1-415.
"BlueGene/L—Hardware Architecture Overview," BlueGene/L design team, IBM Research, Oct. 17, 2003 slide presentation, pp. 1-23.
"BlueGene/L: the next generation of scalable supercomputer," Kissel et al., Lawrence Livermore National Laboratory, Livermore, California, Nov. 18, 2002, 29 pages.
BlueGene Project Update, Jan. 2002, IBM slide presentation, 20 pages.
BlueGene/L, "An Overview of the BlueGene/L Supercomputer," The BlueGene/L Team, IBM and Lawrence Livermore National Laboratory, 2002 IEEE. pp. 1-22.
Bolsens, Ivo (CTO Xilinx), "FPGA, a history of interconnect," Xilinx slide presentation, posted on the internet Oct. 30, 2008 at http://www.docstoc.com/docs/2198008/FPGA-a-history-of-interconnect, 32 pages.
Bondalapati et al., "Reconfigurable Meshes: Theory and Practice," Dept. of Electrical Engineering-Systems, Univ. of Southern California, Apr. 1997, Reconfigurable Architectures Workshop, International Parallel Processing Symposium, 15 pages.
Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5.
Cadambi, et al., "Managing Pipeline-reconfigurable FPGAs," ACM, 1998, pp. 55-64.
Callahan, et al., "The Garp Architecture and C Compiler," Computer, Apr. 2000, pp. 62-69.
Cardoso, J.M.P., et al., "A novel algorithm combining temporal partitioning and sharing of functional units," University of Algarve, Faro, Portugal, 2001 IEEE, pp. 1-10.

(56) References Cited

OTHER PUBLICATIONS

Cardoso, Joao M.P., and Markus Weinhardt, "XPP-VC: A C Compiler with Temporal Partitioning for the PACT-XPP Architecture," Field-Programmable Logic and Applications. Reconfigurable Computing is Going Mainstream, $12^{th}$ International Conference FPL 2002, Proceedings (Lecture Notes in Computer Science, vol. 2438) Springer-Verlag Berlin, Germany, 2002, pp. 864-874.

Cardoso, J.M.P., "Compilation of Java™ Algorithms onto Reconfigurable Computing Systems with Exploitation of Operation-Level Parallelism," Ph.D. Thesis, Universidade Teenica de Lisboa (UTL), Lisbon, Portugal Oct. 2000 (Table of Contents and English Abstract only).

Cardoso, J.M.P., et al., "Compilation and Temporal Partitioning for a Coarse-Grain Reconfigurable Architecture," New Algorithms, Architectures and Applications for Reconfigurable Computing, Lysacht, P. & Rosentiel, W. eds., (2005) pp. 105-115.

Cardoso, J.M.P., et al., "Macro-Based Hardware Compilation of Java™ Bytecodes into a Dynamic Reconfigurable Computing System," IEEE, Apr. 21, 1999, pp. 2-11.

Chaudhry, G.M. et al., "Separated caches and buses for multiprocessor system," Circuits and Systems, 1993; Proceedings of the $36^{th}$ Midwest Symposium on Detroit, MI, USA, Aug. 16-18, 1993, New York, NY IEEE, Aug. 16, 1993, pp. 1113-1116, XP010119918 ISBN: 0-7803-1760-2.

Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.

Cherbaka, Mark F., "Verification and Configuration of a Run-time Reconfigurable Custom Computing Integrated Circuit for DSP Applications," Thesis: Virginia Polytechnic Institute and State University, Jul. 8, 1996, 106 pages.

Clearspeed, CSX Processor Architecture, Whitepaper, PN-1110-0702, 2007, pp. 1-15, www.clearspeed.com.

Clearspeed, CSX Processor Architecture, Whitepaper, PN-1110-0306, 2006, pp. 1-14, www.clearspeed.com.

Coelho, F., "Compiling dynamic mappings with array copies," Jul. 1997, 12 pages, http://delivery.acm.org/10.1145/270000/263786/p168-coelho.pdf.

Compton, K., et al., "Configurable Computing: A Survey of Systems and Software," Northwestern University, Dept. of ECE, Technical Report, 1999, (XP-002315148), 39 pages.

Cong et al., "Structural Gate Decomposition for Depth-Optimal Technology Mapping in LUT-Based FPGA Designs," Univ. of California, ACM Transactions on Design Automation of Electronic Systems, vol. 5, No. 2, Apr. 2000, pp. 193-225.

Cook, Jeffrey J., "The Amalgam Compiler Infrastructure," Thesis at the University of Illinois at Urbana-Champaign (2004) Chapter 7 & Appendix G.

Cronquist, D., et al., "Architecture Design of Reconfigurable Pipelined Datapaths," Department of Computer Science and Engineering, University of Washington, Seattle, WA, Proceedings of the $20^{th}$ Anniversary Conference on Advanced Research in VSLI, 1999, pp. 1-15.

Culler, D.E; Singh, J.P., "Parallel Computer Architecture," pp. 434-437, 1999, Morgan Kaufmann, San Francisco, CA USA, XP002477559.

Culler, D.E; Singh, J.P., "Parallel Computer Architecture," p. 17, 1999, Morgan Kaufmann, San Francisco, CA USA, XP002477559.

DeHon, A., "DPGA Utilization and Application," MIT Artificial Intelligence Laboratory, Proceedings of the Fourth International ACM Symposium on Field-Programmable Gate Arrays (FPGA 1996), IEEE Computer Society, pp. 1-7.

DeHon, Andre, "Reconfigurable Architectures for General-Purpose Computing," Massachusetts Institute of Technology, Technical Report AITR-1586, Oct. 1996, XP002445054, Cambridge, MA, pp. 1-353.

Del Corso et al., "Microcomputer Buses and Links," Academic Press Inc. Ltd., 1986, pp. 138-143, 277-285.

Diniz, P., et al., "Automatic Synthesis of Data Storage and Control Structures for FPGA-based Computing Engines," 2000, IEEE, pp. 91-100.

Diniz, P., et al., "A behavioral synthesis estimation interface for configurable computing," University of Southern California, Marina Del Rey, CA, 2001 IEEE, pp. 1-2.

Donandt, "Improving Response Time of Programmable Logic Controllers by use of a Boolean Coprocessor," AEG Research Institute Berlin, IEEE, 1989, pp. 4-167-4-169.

Dutt, et al., "If Software is King for Systems-in-Silicon, What's New in Compilers?" IEEE, 1997, pp. 322-325.

Ebeling, C., et al., "Mapping Applications to the RaPiD Configurable Architecture," Department of Computer Science and Engineering, University of Washington, Seattle, WA, *FPGAs for Custom Computing Machines, 1997. Proceedings., The 5th Annual IEEE Symposium*, Publication Date: Apr. 16-18, 1997, 10 pages.

Equator, Pixels to Packets, Enabling Multi-Format High Definition Video, Equator Technologies BSP-15 Product Brief, www.equator.com, 2001, 4 pages.

Fawcett, B.K., "Map, Place and Route: The Key to High-Density PLD Implementation," Wescon Conference, IEEE Center (Nov. 7, 1995) pp. 292-297.

Ferrante, J., et al., "The Program Dependence Graph and its Use in Optimization ACM Transactions on Programming Languages and Systems," Jul. 1987, USA, [online]Bd. 9, Nr., 3, pp. 319-349, XP002156651 ISSN: 0164-0935 ACM Digital Library.

Fineberg, S, et al., "Experimental Analysis of a Mixed-Mode Parallel Architecture Using Bitonic Sequence Sorting," Journal of Parallel and Distributed Computing, vol. 11, No. 3, Mar. 1991, pp. 239-251.

FOLDUC, The Free On-Line Dictionary of Computing, "handshaking," online Jan. 13, 1995, retrieved from Internet Jan. 23, 2011 at http://foldoc.org/handshake.

Fornaciari, et al., System-level power evaluation metrics, 1997 Proceedings of the $2^{nd}$ Annual IEEE International Conference on Innovative Systems in Silicon, New York, NY, Oct. 1997, pp. 323-330.

Forstner, "Wer Zuerst Kommt, Mahlt Zuerst!: Teil 3: Einsatzgebiete und Anwendungbeispiele von FIFO-Speichern," Elektronik, Aug. 2000, pp. 104-109.

Franklin, Manoj, et al., "A Fill-Unit Approach to Multiple Instruction Issue," Proceedings of the Annual International Symposium on Microarchitecture, Nov. 1994, pp. 162-171.

Freescale Slide Presentation, An Introduction to Motorola's RCF (Reconfigurable Compute Fabric) Technology, Presented by Frank David, Launched by Freescale Semiconductor, Inc., 2004, 39 pages.

Galanis, M.D. et al., "Accelerating Applications by Mapping Critical Kernels on Coarse-Grain Reconfigurable Hardware in Hybrid Systems," Proceedings of the $13^{th}$ Annual IEEE Symposium on Field-Programmable Custom Computing Machines, 2005, 2 pages.

Genius, D., et al., "A Case for Array Merging in Memory Hierarchies," Proceedings of the 9th International Workshop on Compilers for Parallel Computers, CPC'01 (Jun. 2001), 10 pages.

Gokhale, M.B., et al., "Automatic Allocation of Arrays to Memories in FPGA processors with Multiple Memory Banks," Field-Programmable Custom Computing Machines, 1999, IEEE, pp. 63-69.

Guccione et al., "JBits: Java based interface for reconfigurable computing," Xilinx, Inc., San Jose, CA, 1999, 9 pages.

Guo, Z. et al., "A Compiler Intermediate Representation for Reconfigurable Fabrics," University of California, Riverside, Dept. of Electrical Engineering, IEEE 2006, 4 pages.

Gwennap, Linley, "P6 Underscores Intel's Lead," Microprocessor Report, vol. 9., No. 2, Feb. 16, 1995 (MicroDesign Resources), p. 1 and pp. 6-15.

Gwennap, Linley, "Intel's P6 Bus Designed for Multiprocessing," Microprocessor Report, vol. 9, No. 7 (MicroDesign Resources), May 30, 1995, p. 1 and pp. 6-10.

Hammes, Jeff, et al., "Cameron: High Level Language Compilation for Reconfigurable Systems," Department of Computer Science, Colorado State University, Conference on Parallel Architectures and Compilation Techniques, Oct. 12-16, 1999, 9 pages.

Hartenstein, R. et al., "A new FPGA architecture for word-oriented datapaths," Proc. FPL '94, Springer LNCS, Sep. 1994, pp. 144-155.

(56) References Cited

OTHER PUBLICATIONS

Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.
Hartenstein et al., "Parallelizing Compilation for a Novel Data-Parallel Architecture," 1995, PCAT-94, Parallel Computing: Technology and Practice, 13 pp.
Hartenstein et al., "A Two-Level Co-Design Framework for Xputer-based Data-driven Reconfigurable Accelerators," 1997, Proceedings of the Thirtieth Annual Hawaii International Conference on System Sciences, 10 pp.
Hastic et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).
Hauck, "The Roles of FPGAs in Reprogrammable Systems," IEEE, Apr. 1998, pp. 615-638.
Hauser, Jr., et al., "Garp: A MIPS Processor with a Reconfigurable Coprocessor," University of California, Berkeley, IEEE, Apr. 1997, pp. 12-23.
Hauser, John Reid, (Dissertation) "Augmenting a Microprocessor with Reconfigurable Hardware," University of California, Berkeley, Fall 2000. 255 pages. (submitted in 3 PDFs, Parts I-3).
Hauser, John R., "The Garp Architecture," University of California at Berkeley, Computer Science Division, Oct. 1997, pp. 1-55.
Hedge, S.J., "3D WASP Devices for On-line Signal and Data Processing," 1994, International Conference on Wafer Scale Integration, pp. 11-21.
Hendrich, N., et al., "Silicon Compilation and Rapid Prototyping of Microprogrammed VLSI-Circuits with MIMOLA and SOLO 1400," Microprocessing & Microprogramming (Sep. 1992) vol. 35(1-5), pp. 287-294.
Huang, Libo et al., "A New Architecture for Multiple-Precision Floating-Point Multiply-Add Fused Unit Design," School of Computer National University of Defense Technology, China, IEEE 2007, 8 pages.
Hwang, K., "Advanced Computer Architecture—Parallelism, Scalability, Programmability," 1993, McGraw-Hill, Inc., pp. 348-355.
Hwang, K., "Computer Architecture and Parallel Processing," Data Flow Computers and VLSI Computations, XP-002418655, 1985 McGraw-Hill, Chapter 10, pp. 732-807.
Hwang, L., et al., "Min-cut Replication in Partitioned Networks," IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.
IBM Technical Disclosure Bulletin, IBM Corp., New York, XP000424878, Bd. 36, Nr. 11, Nov. 1, 1993, pp. 335-336.
"IEEE Standard Test Access Port and Boundary-Scan Architecture," IEEE Std. 1149.1-1990, 1993, pp. 1-127.
Imec, "ADRES multimedia processor & 3MF multimedia platform," Transferable 1P, IMEC Technology Description, (Applicants believe the date to be Oct. 2005), 3 pages.
Intel, "Pentium Pro Family Developer's Manual, vol. 3: Operating System Writer's Guide," Intel Corporation, Dec. 1995, [submitted in 4 PDF files: Part 1, Part II, Part III and Part IV], 458 pages.
Intel, Intel MXP5800/MXP5400 Digital Media Processors, Architecture Overview, Jun. 2004, Revision 2.4, pp. 1-24.
Inside DSP, "Ambric Discloses Massively Parallel Architecture," Aug. 23, 2006, http://www.insidedsp.com/Articles/tabid/64/articleType/ArticleView/articleId/155/Default.aspx, 2 pages.
Iseli, C., et al. "A C++ Compiler for FPGA Custom Execution Units Synthesis," IEEE, 1995, pp. 173-179.
Isshiki, Tsuyoshi, et al., "Bit-Serial Pipeline Synthesis for Multi-FPGA Systems with C++ Design Capture," 1996 IEEE, pp. 38-47.
Jacob, J., et al., "Memory Interfacing and Instruction Specification for Reconfigurable Processors," ACM Feb. 1999, pp. 145-154.
Janssen et al., "A Specification Invariant Technique for Regularity Improvement between Flow-Graph Clusters," Mar. 1996, 6 pages, http://delivery.acm.org/10.1145/790000/787534/74230138.pdf.
Jantsch, Axel et al., "A Case Study on Hardware/Software Partitioning," Royal Institute of Technology, Kista, Sweden, Apr. 10, 1994, IEEE, pp. 111-118.
Jantsch, Axel et al., "Hardware/Software Partitioning and Minimizing Memory Interface Traffic," Electronic System Design Laboratory, Royal Institute of Technology, ESDLab, Electrum 229, S-16440 Kista, Sweden (Apr. 1994), pp. 226-231.
Jo, Manhwee et al., "Implementation of Floating-Point Operations for 3D Graphics on a Coarse-Grained Reconfigurable Architecture," Design Automation Laboratory, School of EE/CS, Seoul National University, Korea, IEEE 2007, pp. 127-130.
John, L., et al., "A Dynamically Reconfigurable Interconnect for Array Processors," vol. 6, No. 1, Mar. 1998, IEEE, pp. 150-157.
Kanter, David, "NVIDIA's GT200: Inside a Parallel Processor," http://www.realworldtech.com/page.cfm?ArticleID=RWT090989195242&p=1, Sep. 8, 2008, 27 pages.
Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.
Kaul, M., et al., "An automated temporal partitioning and loop fission approach of FPGA based reconfigurable synthesis of DSP applications," University of Cincinnati, Cincinnati, OH, ACM 1999, pp. 616-622.
Kean, T.A., "Configurable Logic: A Dynamically Programmable Cellular Architecture and its VLSI Implementation," University of Edinburgh (Dissertation) 1988, pp. 1-286. [in two PDFs, Pt. 1 and Pt. 2].
Kean, T., et al., "A Fast Constant Coefficient Multiplier for the XC6200," Xilinx, Inc., Lecture Notes in Computer Science, vol. 1142, Proceedings of the 6$^{th}$ International Workshop of Field-Programmable Logic, 1996, 7 pages.
Kim et al., "A Reconfigurable Multifunction Computing Cache Architecture," IEEE Transactions on Very Large Scale Integration (VLSI) Systems vol. 9, Issue 4, Aug. 2001 pp. 509-523.
Knittel, Gunter, "A PCI-compatible FPGA-Coprocessor for 2D/3D Image Processing," University of Turgingen, Germany, 1996 IEEE, pp. 136-145.
Koch, A., et al., "Practical Experiences with the SPARXIL Co-Processor," 1998, IEEE, pp. 394-398.
Koch, Andreas et al., "High-Level-Language Compilation for Reconfigurable Computers," Proceedings of European Workshop on Reconfigurable Communication-Centric SOCS (Jun. 2005) 8 pages.
Koren et al., "A data-driven VLSI array for arbitrary algorithms," IEEE Computer Society, Long Beach, CA vol. 21, No. 10, Oct. 1, 1988, pp. 30-34.
Kung, "Deadlock Avoidance for Systolic Communication," 1988 Conference Proceedings of the 15$^{th}$ Annual International Symposium on Computer Architecture, May 30, 1998, pp. 252-260.
Lange, H. et al., "Memory access schemes for configurable processors," Field-Programmable Logic and Applications, International Workshop, FPL, Aug. 27, 2000, pp. 615-625, XP02283963.
Larsen, S., et al., "Increasing and Detecting Memory Address Congruence," Proceedings of the 2002 IEEE International Conference on Parallel Architectures and Compilation Techniques (PACT'02), pp. 1-12 (Sep. 2002).
Lee et al., "A new distribution network based on controlled switching elements and its applications," IEEE/ACT Trans. of Networking, vol. 3, No. 1, pp. 70-81, Feb. 1995.
Lee, Jong-eun, et al., "Reconfigurable ALU Array Architecture with Conditional Execution," International Soc. Design Conference (ISOOC) [online] Oct. 25, 2004, Seoul, Korea, 5 pages.
Lee, R. B., et al., "Multimedia extensions for general-purpose processors," *IEEE Workshop on Signal Processing Systems, SIPS 97—Design and Implementation* (1997), pp. 9-23.
Lee, Ming-Han et al., "Design and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.
Li et al., "Hardware-Software Co-Design of Embedded Reconfigurable Architectures," Los Angeles, CA, 2000 ACM, pp. 507-512.

(56) References Cited

OTHER PUBLICATIONS

Li, Zhiyuan, et al., "Configuration prefetching techniques for partial reconfigurable coprocessor with relocation and defragmentation," International Symposium on Field Programmable Gate Arrays, Feb. 1, 2002, pp. 187-195.

Ling, X, "WASMII: An MPLD with Data-Driven Control on a Virtual Hardware," Journal of Supercomputing, Kluwer Academic Publishers, Dordrecht, Netherlands, 1995, pp. 253-276.

Ling et al., "WASMII: A Multifunction Programmable Logic Device (MPLD) with Data Driven Control," The Transactions of the Institute of Electronics, Information and Communication Engineers, Apr. 25, 1994, vol. J77-D-1, Nr. 4, pp. 309-317.

Mano, M.M., "Digital Design," by Prentice Hall, Inc., Englewood Cliffs, New Jersey 07632, 1984, pp. 119-125, 154-161.

Margolus, N., "An FPGA architecture for DRAM-based systolic computations," Boston University Center for Computational Science and MIT Artificial Intelligence Laboratory, IEEE 1997, pp. 2-11.

Marshall et al., "A Reconfigurable Arithmetic Array for Multimedia Applications," FPGA '99 Proceedings of the 1999 ACM/SIGDA Seventh International Symposium on Field Programmable Gate Arrays, 10 pages.

Maxfield,C., "Logic that Mutates While-U-Wait," EDN (Bur. Ed) (USA), EDN (European Edition), Nov. 7, 1996, Cahners Publishing, USA, pp. 137-140, 142.

Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).

Mei, Bingfeng et al., "Design and Optimization of Dynamically Reconfigurable Embedded Systems," IMEC vzw, 2003, Belgium, 7 pages, http://www.imec.be/reconfigurable/pdf/ICERSA_01_design.pdf.

Mei, Bingfeng et al., "Adres: An Architecture with Tightly Coupled VLIW Processor and Coarse-Grained Reconfigurable Matrix," Proc. *Field-Programmable Logic and Applications* (FPL 03), Springer, 2003, pp. 61-70.

Melvin, Stephen et al., "Hardware Support for Large Atomic Units in Dynamically Scheduled Machines," Computer Science Division, University of California, Berkeley, IEEE (1988), pp. 60-63.

Microsoft Press Computer Dictionary, Second Edition, 1994, Microsoft Press, ISBN 1-55615-597-2, p. 10.

Miller, M.J., et al., "High-Speed FIFOs Contend with Widely Differing Data Rates: Dual-port RAM Buffer and Dual-pointer System Provide Rapid, High-density Data Storage and Reduce Overhead," Computer Design, Sep. 1, 1985, pp. 83-86.

Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-166.

Miyamori, T., et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.

Moraes, F., et al., "A Physical Synthesis Design Flow Based on Virtual Components," XV Conference on Design of Circuits and Integrated Systems (Nov. 2000) 6 pages.

Muchnick, S., "Advanced Compiler Design and Implementation," (Morgan Kaufmann 1997), Table of Contents, 11 pages.

Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.

Myers, G. "Advances in Computer Architecture," Wiley-Interscience Publication, 2nd ed., John Wiley & Sons, Inc., 1978, pp. 463-494.

Nageldinger, U., "Design-Space Exploration for Coarse Grained Reconfigurable Architectures," (Dissertation) Universitaet Kaiserslautern, 2000, Chapter 2, pp. 19-45.

Neumann, T., et al., "A Generic Library for Adaptive Computing Environments," Field Programmable Logic and Applications, 11th International Conference, FPL 2001, Proceedings (Lecture Notes in Computer Science, vol. 2147) (2001) pp. 503-512.

Newton, Harry, "Newton's Telecom Dictionary," Ninteenth Edition, 2003, CMP Books, p. 40.

Nilsson, et al., "The Scalable Tree Protocol—A Cache Coherence Approaches for Large-Scale Multiprocessors," IEEE, pp. 498-506, Dec. 1992.

Norman, R.S., "Hyperchip Business Summary, The Opportunity," Jan. 31, 2000, pp. 1-3.

Ohmsha, "Information Processing Handbook," edited by the Information Processing Society of Japan, pp. 376, Dec. 21, 1998.

Olukotun, K., "The Case for a Single-Chip Microprocessor," ACM Sigplan Notices, ACM, Association for Computing Machinery, New York, vol. 31, No. 9, Sep. 1996 pp. 2-11.

Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.

PACT Corporation, "The XPP Communication System," Technical Report 15 (2000), pp. 1-16.

Parhami, B., "Parallel Counters for Signed Binary Signals," Signals, Systems and Computers, 1989, Twenty-Third Asilomar Conference, vol. 1, pp. 513-516.

PCI Local Bus Specification, Production Version, Revision 2.1, Portland, OR, Jun. 1, 1995, pp. 1-281.

Piotrowski, A., "IEC-BUS, Die Funktionsweise des IEC-Bus uncle seine Anwendung in Geräten and Systemen," 1987, Franzis-Verlag GmbH, München, pp. 20-25. [English Abstract Provided].

Pirsch, P. et al., "VLSI implementations of image and video multimedia processing systems," *IEEE Transactions on Circuits and Systems for Video Technology*, vol. 8, No. 7, Nov. 1998, pp. 878-891.

Pistorius et al., "Generation of Very Large Circuits to Benchmark the Partitioning of FPGAs," Monterey, CA, ACM 1999, pp. 67-73.

Price et al., "Debug of Reconfigurable Systems," Xilinx, Inc., San Jose, CA, Proceedings of SPIE, 2000, pp. 181-187.

Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100.

Ramanathan et al., "Reconfigurable Filter Coprocessor Architecture for DSP Applications," Journal of VLSI Signal Processing, 2000, vol. 26, pp. 333-359.

Rehmouni et al., "Formulation and evaluation of scheduling techniques for control flow graphs," Dec. 1995, 6 pages, http://delivery.acm.org/10.1145/230000/224352/p386-rahmouni.pdf.

Razdan et al., A High-Performance Microarchitecture with Hardware-Programmable Functional Units, Micro-27, Proceedings of the 27th Annual International Symposium on Microarchitecture, IEEE Computer Society and Association for Computing Machinery, Nov. 30-Dec. 2, 1994, pp. 172-180.

Rotenberg, Eric., et al., "Trace Cache: a Low Latency Approach to High Bandwidth Instruction Fetching," Proceedings of the 29th Annual International Symposium on Microarchitecture, Paris, France, IEEE (1996), 12 pages.

Ryo, A., "Auszug aus Handbuch der Informationsverarbeitung," ed. Information Processing Society of Japan, *Information Processing Handbook, New Edition*, Software Information Center, Ohmsha, Dec. 1998, 4 pages. [Translation provided].

Saleeba, Z.M.G., "A Self-Reconfiguring Computer System," Department of Computer Science, Monash University (Dissertation) 1998, pp. 1-306.

Saleeba, M. "A Self-Contained Dynamically Reconfigurable Processor Architecture," Sixteenth Australian Computer Science Conference, ASCS-16, QLD, Australia, Feb. 1993, pp. 59-70.

Salefski, B. et al., "Re-configurable computing in wireless," *Annual ACM IEEE Design Automation Conference: Proceedings of the 38th conference on Design automation* (2001) pp. 178-183.

Schmidt, H. et al., "Behavioral synthesis for FGPA-based computing," Carnegie Mellon University, Pittsburgh, PA, 1994 IEEE, pp. 125-132.

(56) References Cited

OTHER PUBLICATIONS

Schmidt, U. et al., "Datawave: A Single-Chip Multiprocessor for Video Applications," *IEEE Micro*, vol. 11, No. 3, May/Jun. 1991, pp. 22-25, 88-94.
Schmit, et al., "Hidden Markov Modeling and Fuzzy Controllers in FPGAs, FPGAs for Custom Computing Machines," 1995; Proceedings, IEEE Symposium in Napa Valley, CA, Apr. 1995, pp. 214-221.
Schönfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, (Oct. 1, 1995) vol. 11(1/2), pp. 51-74.
Shanley, Tom. *Pentium Pro and Pentium II System Architecture*, MindShare, Inc., Addition Wesley, 1998, Second Edition, pp. 11-17; Chapter 7; Chapter 10; pp. 209-211, and p. 394.
Shin, D., et al., "C-based Interactive RTL Design Methodology," Technical Report CECS-03-42 (Dec. 2003) pp. 1-16.
Shirazi, et al., "Quantitative analysis of floating point arithmetic on FPGA based custom computing machines," IEEE Symposium on FPGAs for Custom Computing Machines, *IEEE Computer Society Press*, Apr. 19-21, 1995, pp. 155-162.
Short, Kenneth L., *Microprocessors and Programmed Logic*, Prentic Hall, Inc., New Jersey 1981, p. 34.
Shoup, Richard, "Programmable Cellular Logic Arrays," Dissertation, Computer Science Department, Carnegie-Mellon University, Mar. 1970, 193 pages.
Siemers, C., "Rechenfabrik Ansaetze Fuer Extrem Parallele Prozessoren," Verlag Heinze Heise GmbH., Hannover, DE No. 15, Jul. 16, 2001, pp. 170-179.
Siemers et al., "The >S<puter: A Novel Micoarchitecture Model for Execution inside Superscalar and VLIW Processors Using Reconfigurable Hardware," Australian Computer Science Communications, vol. 20, No. 4, Computer Architecture, Proceedings of the 3$^{rd}$ Australian Computer Architecture Conference, Perth John Morris, Ed., Feb. 2-3, 1998, pp. 169-178.
Simunic, et al., Source Code Optimization and Profiling of Energy Consumption in Embedded Systems, Proceedings of the 13$^{th}$ International Symposium on System Synthesis, Sep. 2000, pp. 193-198.
Singh, H. et al., "MorphoSys: An Integrated Reconfigurable System for Data-Parallel Computation-Intensive Applications," University of California, Irvine, CA. and Federal University of Rio de Janeiro, Brazil, 2000, IEEE Transactions on Computers, pp. 1-35; also published in *IEEE Transactions on Computers*, vol. 49, No. 5, May 2000, pp. 465-481.
Sinha et al., "System-dependence-graph-based slicing of programs with arbitrary interprocedural control flow," May 1999, 10 pages, http://delivery.acm.org/10.1145/310000/203675/p432-sinha.pdf.
Skokan, Z.E., "Programmable logic machine (A programmable cell array)," IEEE Journal of Solid-State Circuits, vol. 18, Issue 5, Oct. 1983, pp. 572-578.
Sondervan, J., "Retiming and logic synthesis," Electronic Engineering (Jan. 1993) vol. 65(793), pp. 33, 35-36.
Soni, M., "VLSI Implementation of a Wormhole Run-time Reconfigurable Processor," Jun. 2001, (Masters Thesis)Virginia Polytechnic Institute and State University, 88 pages.
Stallings, William, "Data & Computer Communications," Sixth Edition, Jun. 2000, Prentice-Hall, Inc., ISBN 0-084370-9, pp. 195-196.
Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only].
Sundararajan et al., "Testing FPGA Devices Using JBits," Proc. MAPLD 2001, Maryland, USA, Katz (ed.), NASA, CA, 8 pages.
Sutton et al., "A Multiprocessor DSP System Using PADDI-2," U.C. Berkeley, 1998 ACM, pp. 62-65.
Tau, E., et al., "A First Generation DPGA Implementation," *FPD '95*, pp. 138-143.
Tenca, A.F., et al., "A Variable Long-Precision Arithmetic Unit Design for Reconfigurable Coprocessor Architectures," University of California, Los Angeles, 1998, pp. 216-225.
The XPP White Paper, Release 2.1, PACT—A Technical Perspective, Mar. 27, 2002, pp. 1-27.
TMS320C54X DSP: CPU and Peripherals, Texas Instruments, 1996, 25 pages.
TMS320C54x DSP: Mnemonic Instruction Set, Texas Instruments, 1996, 342 pages.
Translation of DE 101 39 170, filed Aug. 16, 2001, by examiner in related case using Google Translate, 10 pages.
Tsutsui, A., et al., "YARDS: FPGA/MPU Hybrid Architecture for Telecommunication Data Processing," NTT Optical Network Systems Laboratories, Japan, 1997 ACM, pp. 93-99.
Vasell et al., "The Function Processor: A Data-Driven Processor Array for Irregular Computations," Chalmers University of Technology, Sweden, 1992, pp. 1-21.
Venkatachalam et al., "A highly flexible, distributed multiprocessor architecture for network processing," Computer Networks, The International Journal of Computer and Telecommunications Networking, vol. 41, No. 5, Apr. 5, 2003, pp. 563-568.
Villasenor, et al., "Configurable Computing Solutions for Automatic Target Recognition," *IEEE*, 1996 pp. 70-79.
Villasenor, et al., "Configurable Computing," *Scientific American*, vol. 276, No. 6, Jun. 1997, pp. 66-71.
Villasenor, et al., "Express Letters Video Communications Using Rapidly Reconfigurable Hardware," IEEE Transactions on Circuits and Systems for Video Technology, IEEE, Inc., NY, Dec. 1995, pp. 565-567.
Wada, et al., "A Performance Evaluation of Tree-based Coherent Distributed Shared Memory," Proceedings of the Pacific RIM Conference on Communications, Comput and Signal Processing, Victoria, May 19-21, 1993, pp. 390-393.
Waingold, E., et al., "Baring it all to software: Raw machines," IEEE Computer, Sep. 1997, at 86-93.
Webster's Ninth New Collegiate Dictionary, Merriam-Webster, Inc., 1990, p. 332 (definition of "dedicated").
Weinhardt, M., "Compilation Methods for Structure-programmable Computers," dissertation, ISBN 3-89722-011-3, 1997. [Table of Contents and English Abstract Provided].
Weinhardt, Markus et al., "Pipeline Vectorization for Reconfigurable Systems," 1999, IEEE, pp. 52-62.
Weinhardt, Markus et al., "Pipeline Vectorization," IEEE Transactions on Computer-Aided Design of Integrated Circuits and Systems, vol. 20, No. 2, Feb. 2001, pp. 234-248.
Weinhardt, Markus et al., "Memory Access Optimization for Reconfigurable Systems," IEEE Proceedings Computers and Digital Techniques, 48(3) (May 2001) pp. 1-16.
Wittig, et al., "OneChip: An FPGA Processor with Reconfigurable Logic," IEEE, 1996, pp. 126-135.
Wolfe, M. et al., "High Performance Compilers for Parallel Computing," (Addison-Wesley 1996) Table of Contents, 11 pages.
Wu, et al., "A New Cache Directory Scheme," IEEE, pp. 466-472, Jun. 1996.
Xilinx, "Logic Cell Array Families: XC4000, XC4000A and XC4000H," 1994, product description, pp. 2-7, 2-9, 2-14, 2-15, 8-16, and 9-14.
Xilinx, "The Programmable Logic Data Book," 1994, Section 2,pp. 1-231, Section 8, pp. 1, 23-25, 29, 45-52, 169-172.
Xilinx, "Spartan and SpartanXL Families Field Programmable Gate Arrays," Jan. 1999, Xilinx, pp. 4-3 through 4-70.
Xilinx "XC6200 Field Programmable Gate Arrays," Apr. 24, 1997, Xilinx product description, pp. 1-73.
Xilinx, "XC3000 Series Field Programmable Gate Arrays," Nov. 6, 1998, Xilinx product description, pp. 1-76.
Xilinx, "XC4000E and XC4000X Series Field Programmable Gate Arrays," May 14, 1999, Xilinx product description, pp. 1-68.
Xilinx, "Virtex-E 1.8 V Extended Memory Field Programmable Gate Arrays," (v1.5) Jul. 17, 2002, Xilinx Production Product Specification, pp. 1-118.
Xilinx, "Virtex-E 1.8 V Extended Memory Field Programmable Gate Arrays," (v2.2) Sep. 10, 2002, Xilinx Production Product Specification, pp. 1-52.

(56) References Cited

OTHER PUBLICATIONS

Xilinx, "Virtex-II and Virtex-II Pro X FPGA User Guide," Mar. 28, 2007, Xilinx user guide, pp. 1-559.
Xilinx, "Virtex-II and Virtex-II Pro X FPGA Platform FPGAs: Complete Data Sheet," (v4.6) Mar. 5, 2007, pp. 1-302.
Xilinx, "Virtex-II Platform FPGAs: Complete Data Sheet," (v3.5) Nov. 5, 2007, pp. 1-226.
Xilinx, White Paper 370: (Virtex-6 and Spartan-6 FPGA Families) "Reducing Switching Power with Intelligent Clock Gating," Frederic Rivoallon, May 3, 2010, pp. 1-5.
Xilinx, White Paper 298: (Spartan-6 and Virtex-6 Devices) "Power Consumption at 40 and 50 nm," Matt Klein, Apr. 13, 2009, pp. 1-21.
Xu, H. et al., "Parallel QR Factorization on a Block Data Flow Architecture," Conference Proceeding Article, Mar. 1, 1992, pp. 332-336.
Ye, Z.A. et al., "A C-Compiler for a Processor With a Reconfigurable Functional Unit," FPGA 2000 ACM/SIGNA International Symposium on Field Programmable Gate Arrays, Monterey, CA Feb. 9-11, 2000, pp. 95-100.
Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.
Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993.
Zhang, et al., "Architectural Evaluation of Flexible Digital Signal Processing for Wireless Receivers, Signals, Systems and Computers," 2000; Conference Record of the Thirty-Fourth Asilomar Conference, Bd. 1, Oct. 29, 2000, pp. 78-83.
Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.
Zhang et al., "Abstract: Low-Power Heterogeneous Reconfigurable Digital Signal Processors with Energy-Efficient Interconnect Network," U.C. Berkeley (2004), pp. 1-120.
Zima, H. et al., "Supercompilers for parallel and vector computers," (Addison-Wesley 1991) Table of Contents, 5 pages.
Zucker, Daniel F., "A Comparison of Hardware Prefetching Techniques for Multimedia Benchmarks," Technical Report: CSL-TR-95-683, Dec. 1995, 26 pages.
Xilinx, Inc.'s and Avnet, Inc.'s Disclosure Pursuant to P.R. 4-2; *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, 4 pages.
Xilinx, Inc.'s and Avnet, Inc.'s Disclosure Pursuant to P.R. 4-1; *PACT XPP Technologies, AG. v. Xilinx, Inc. and Avnet, Inc.*, Case No, 2:07-cv-00563-TJW-CE, U.S. District Court for the Eastern District of Texas, Dec. 28, 2007, 9 pages.
Defendant's Claim Construction Chart for P.R. 4-2 Constructions and Extrinsic Evidence for Terms Proposed by Defendants, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-19.
PACT's P.R. 4-1 List of Claim Terms for Construction, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-7.
PACT's P.R. 4-2 Preliminary Claim Constructions and Extrinsic Evidence, *PACT XPP Technologies, AG. v. Xilinx, Inc. and Avnet, Inc.*, Case No. 2:07-cv-00563-TJW-CE, U.S. District Court for the Eastern District of Texas, Dec. 28, 2007, pp. 1-16, and Exhibits re Extrinsic Evidence Parts in seven (7) separate additional PDF files (Parts 1-7).
Information Disclosure Statement submitted for U.S. Appl. No. 10/501,903, received by USPTO Jul. 5, 2013.
Information Disclosure Statement submitted for U.S. Appl. No. 10/501,903, received by USPTO Aug. 29, 2012.
Information Disclosure Statement submitted for U.S. Appl. No. 10/501,903, received by USPTO Apr. 26, 2012.
Information Disclosure Statement submitted for U.S. Appl. No. 10/501,903, received by USPTO Mar. 23, 2012.
Information Disclosure Statement submitted for U.S. Appl. No. 10/501,903, received by USPTO Nov. 29, 2011.
Information Disclosure Statement submitted for U.S. Appl. No. 10/501,903, received by USPTO Sep. 29, 2011.
Information Disclosure Statement submitted for U.S. Appl. No. 10/501,903, received by USPTO Jun. 30, 2011.
Information Disclosure Statement submitted for U.S. Appl. No. 10/501,903, received by USPTO May 3, 2011.
Information Disclosure Statement submitted for U.S. Appl. No. 10/501,903, received by USPTO Feb. 2, 2011.
Information Disclosure Statement submitted for U.S. Appl. No. 10/501,903, received by USPTO Jan. 6, 2011.
Information Disclosure Statement submitted for U.S. Appl. No. 10/501,903, received by USPTO Oct. 21, 2010.
Information Disclosure Statement submitted for U.S. Appl. No. 10/501,903, received by USPTO Sep. 14, 2010.
Information Disclosure Statement submitted for U.S. Appl. No. 10/501,903, received by USPTO Aug. 24, 2010.
Information Disclosure Statement submitted for U.S. Appl. No. 10/501,903, received by USPTO Jul. 26, 2010.
Information Disclosure Statement submitted for U.S. Appl. No. 10/501,903, received by USPTO Feb. 24, 2010.
Information Disclosure Statement submitted for U.S. Appl. No. 10/501,903, received by USPTO Apr. 3, 2008.
Information Disclosure Statement submitted for U.S. Appl. No. 10/501,903, received by USPTO Nov. 9, 2006.
Information Disclosure Statement submitted for U.S. Appl. No. 10/501,903, received by USPTO Mar. 7, 2005.
Information Disclosure Statement submitted for U.S. Appl. No. 10/501,903, received by USPTO Oct. 1, 2004.
Information Disclosure Statement submitted for U.S. Appl. No. 10/501,903, received by USPTO Jul. 16, 2004.
Information Disclosure Statement submitted for U.S. Appl. No. 10/551,891, received by USPTO Aug. 29, 2012.
Information Disclosure Statement submitted for U.S. Appl. No. 10/551,891, received by USPTO Apr. 26, 2012.
Information Disclosure Statement submitted for U.S. Appl. No. 10/551,891, received by USPTO Mar. 26, 2012.
Information Disclosure Statement submitted for U.S. Appl. No. 10/551,891, received by USPTO Dec. 21, 2011.
Information Disclosure Statement submitted for U.S. Appl. No. 10/551,891, received by USPTO May. 4, 2011.
Information Disclosure Statement submitted for U.S. Appl. No. 10/551,891, received by USPTO Feb. 10, 2011.
Information Disclosure Statement submitted for U.S. Appl. No. 10/551,891, received by USPTO Oct. 25, 2010.
Information Disclosure Statement submitted for U.S. Appl. No. 10/551,891, received by USPTO Sep. 14, 2010.
Information Disclosure Statement submitted for U.S. Appl. No. 10/551,891, received by USPTO Aug. 24, 2010.
Information Disclosure Statement submitted for U.S. Appl. No. 10/551,891, received by USPTO Jul. 23, 2010.
Information Disclosure Statement submitted for U.S. Appl. No. 10/551,891, received by USPTO Jun. 30, 2010.
Information Disclosure Statement submitted for U.S. Appl. No. 10/551,891, received by USPTO Mar. 16, 2010.
Information Disclosure Statement submitted for U.S. Appl. No. 10/551,891, received by USPTO Apr. 30, 2009.
Information Disclosure Statement submitted for U.S. Appl. No. 10/551,891, received by USPTO Apr. 21, 2009.
Information Disclosure Statement submitted for U.S. Appl. No. 10/551,891, received by USPTO Mar. 26, 2009.
Information Disclosure Statement submitted for U.S. Appl. No. 10/551,891, received by USPTO Mar. 23, 2009.
Information Disclosure Statement submitted for U.S. Appl. No. 10/551,891, received by USPTO Mar. 18, 2009.
Information Disclosure Statement submitted for U.S. Appl. No. 10/551,891, received by USPTO Nov. 19, 2007 and Nov. 14, 2007.

(56) References Cited

OTHER PUBLICATIONS

Information Disclosure Statement submitted for U.S. Appl. No. 10/551,891, received by USPTO Oct. 3, 2005.
Information Disclosure Statement submitted for U.S. Appl. No. 12/571,195, received by USPTO Sep. 11, 2012.
Information Disclosure Statement submitted for U.S. Appl. No. 12/571,195, received by USPTO May 1, 2012.
Information Disclosure Statement submitted for U.S. Appl. No. 12/571,195, received by USPTO Mar. 23, 2012.
Information Disclosure Statement submitted for U.S. Appl. No. 12/571,195, received by USPTO Nov. 15, 2011.
Information Disclosure Statement submitted for U.S. Appl. No. 12/571,195, received by USPTO Nov. 14, 2011.
Information Disclosure Statement submitted for U.S. Appl. No. 12/571,195, received by USPTO Apr. 12, 2011.
Information Disclosure Statement submitted for U.S. Appl. No. 12/571,195, received by USPTO Feb. 2, 2011.
Information Disclosure Statement submitted for U.S. Appl. No. 12/571,195, received by USPTO Jan. 10, 2011.
Information Disclosure Statement submitted for U.S. Appl. No. 12/571,195, received by USPTO Oct. 28, 2010.
Information Disclosure Statement submitted for U.S. Appl. No. 12/571,195, received by USPTO Sep. 15, 2010.
Information Disclosure Statement submitted for U.S. Appl. No. 12/571,195, received by USPTO Aug. 24, 2010.
Information Disclosure Statement submitted for U.S. Appl. No. 12/571,195, received by USPTO Jul. 26, 2010.
Information Disclosure Statement submitted for U.S. Appl. No. 12/571,195, received by USPTO Jun. 30, 2010.
Information Disclosure Statement submitted for U.S. Appl. No. 12/571,195, received by USPTO Jun. 8, 2010.
Information Disclosure Statement submitted for U.S. Appl. No. 12/571,195, received by USPTO May 25, 2010.
Information Disclosure Statement submitted for U.S. Appl. No. 12/571,195, received by USPTO Mar. 23, 2010.
Information Disclosure Statement submitted for U.S. Appl. No. 12/571,195, received by USPTO Dec. 21, 2009.

* cited by examiner

RECONFIGURABLE SEQUENCER STRUCTURE

CROSS-REFERENCE TO RELATED APPLICATIONS

This application is a continuation of U.S. patent application Ser. No. 13/040,769, filed Mar. 4, 2011, which is a continuation of U.S. patent application Ser. No. 12/836,364, filed Jul. 14, 2010, which is a continuation of U.S. patent application Ser. No. 12/541,299, filed on Aug. 14, 2009, which is a continuation of U.S. patent application Ser. No. 12/082,073, filed on Apr. 7, 2008, which is a continuation of U.S. patent application Ser. No. 10/526,595, filed on Jan. 9, 2006, which is the National Stage of International Patent Application Serial No. PCT/EP2003/009957, filed on Sep. 8, 2003, which claims benefit of and priority to German Patent Application Serial No. DE 102 41 812.8, filed on Sep. 6, 2002, the entire contents of each of which are expressly incorporated herein by reference thereto.

DESCRIPTION

The present invention relates to a cell element field and a method for operating same. The present invention thus relates in particular to reconfigurable data processing architectures.

The term reconfigurable architecture is understood to refer to units (VPUs) having a plurality of elements whose function and/or interconnection is variable during run time. These elements may include arithmetic logic units, FPGA areas, input/output cells, memory cells, analog modules, etc. Units of this type are known by the term VPU, for example. These typically include arithmetic and/or logic and/or analog and/or memory and/or interconnecting modules and/or communicative peripheral modules (IOs), typically referred to as PAEs, which are arranged in one or more dimensions and are linked together directly or by one or more bus systems. PAEs are arranged in any configuration, mixture and hierarchy, the system being known as a PAE array or, for short, a PA. A configuring unit may be assigned to the PAE. In addition to VPU units, in principle systolic arrays, neural networks, multiprocessor systems, processors having multiple arithmetic units and/or logic cells, interconnection and network modules such as crossbar circuits, etc., as well as FPGAs, DPGAs, transputers, etc., are also known It should be pointed out that essential aspects of VPU technology are described in the following protective rights of the same applicant as well as in the particular follow-up applications to the protective rights listed here:
P 44 16 881.0-53, DE 197 81 412.3, DE 197 81 483.2, DE 196 54 846.2-53, DE 196 54 593.5-53, DE 197 04 044.6-53, DE 198 80 129.7, DE 198 61 088.2-53, DE 199 80 312.9, PCT/DE 00/01869, DE 100 36 627.9-33, DE 100 28 397.7, DE 101 10 530.4, DE 101 11 014.6, PCT/EP 00/10516, EP 01 102 674.7, DE 102 06 856.9, 60/317,876, DE 102 02 044.2, DE 101 29 237.6-53, DE 101 39 170.6.

It should be pointed out that the documents listed above are incorporated in particular with regard to particulars and details of the interconnection, configuration, embodiment of architecture elements, trigger methods, etc., for disclosure purposes.

The architecture has considerable advantages in comparison with traditional processor architectures inasmuch as data processing is performed in a manner having a large proportion of parallel and/or vectorial data processing steps. However, the advantages of this architecture in comparison with other processor units, coprocessor units or data processing units in general are not as great when the advantages of interconnection and of the given processor architectonic particulars are no longer achievable to the full extent.

This is the case in particular when data processing steps that are traditionally best mappable on sequencer structures are to be executed. It is desirable to design and use the reconfigurable architecture in such a way that even those data processing steps which are typically particularly suitable for being executed using sequencers are executable particularly rapidly and efficiently.

The object of the present invention is to provide a novel device and a novel method for commercial application.

The method of achieving this object is claimed independently. Preferred embodiments are characterized in the subclaims.

According to a first essential aspect of the present invention, in the case of a cell element field whose function and/or interconnection is reconfigurable in particular during run time without interfering with unreconfigured elements for data processing with coarsely granular function cell elements in particular for execution of algebraic and/or logic functions and memory cell means for receiving, storing and/or outputting information, it is proposed that function cell-memory cell combinations be formed in which a control connection to the memory means is managed by the function cell means. This control connection is for making the address and/or data input/output from the memory controllable through the particular function cell, typically an ALU-PAE, It is thus possible to indicate, for example, whether the next item of information transmitted is to be handled as an address or as data and whether read and/or write access is necessary. This transfer of data from the memory cell, i.e., the memory cell means, which may be a RAM-PAE, for example, to the function cell means, which may be an ALU-PAE, for example, then makes it possible for new commands that are to be executed by the ALU to be loadable into the latter. It should be pointed out that function cell means and memory cell means may be combined by integration into a structural unit. In such a case it is possible to use a single bus connection to input data into the memory cell means and/or the ALU. Suitable input registers and/or output registers may then be provided and, if desired, additional data registers and/or configuration registers different from the former may also be provided as memory cell means.

It should also be pointed out that it is possible to construct a cell element field containing a plurality of different cells and/or cell groups, strips or similar regular patterns being preferably provided with the different cells because these permit a very regular arrangement while facilitating the design equally in terms of hardware design and operation. With such a strip-like arrangement or other regular layout of a small plurality of different cell elements, for example, elements having integrated function cell means-memory cell means combinations, i.e., cells in which function cell means and memory cell means are integrated according to the present invention, are provided centrally in the field, where typically only a few different program steps are to be executed within a sequencer structure because, as has been recognized, this provides very good results for traditional data stream applications, while more complex sequencer structures may be constructed at the edges of the field where, for example, an ALU-PAE which represents a separate unit possibly may be provided in addition to a separate RAM-PAE and optionally a number of I/O-PAEs using, i.e., arranging appropriate control lines or connections thereof because frequently more memory is needed there, e.g., to temporarily store results generated in the field central area of the cell element field and/or for datastreaming, to pre-enter and/or process data needed thereby.

When cells that integrate memory cell means and function cell means are provided, e.g., in the center of the field, a small memory may then be provided there for different commands to be executed by the function cell means such as the ALU. It is possible here in particular to separate the command memory and/or the configuration memory from a data memory, and it is possible to design the function memory to be so large that alternatively, one of several, e.g., two different sequences may be executed. The particular sequence to be executed may occur in response to results generated in the cell and/or control signals such as carry signals, overflow signals, and/or trigger signals arriving from the outside. In this way, this arrangement may also be used for wave reconfiguration methods.

In this way it is possible to construct a sequencer structure in a cell element field by providing a dedicated control connection controlled by function cells in a dedicated manner between function cell and function cell means and memory cell and/or memory cell means with only two elements connected by suitable buses without requiring additional measures and/or design changes otherwise. Data, addresses, program steps, etc., may be stored in the memory cell in a manner known per se from traditional processors. Since both elements, if properly configured, may also be used in another way, this yields a particularly efficient design which is particularly adaptable to sequencer structures as well as vectorial and/or parallelizable structures. Parallelization may thus be supported merely via suitable PAE configurations, i.e., by providing PAEs that operate in two different spatial directions and/or via cell units equipped with data throughput registers.

It is clear here that a plurality of sequencer type structures may be constructed in the reconfigurable cell element field by using only two cells in a cell element field, namely the function cell and the information processing cell. This is advantageous inasmuch as a number of different tasks that are different from one another per se must often be executed in data processing, e.g., in a multitasking-capable operating system. A plurality of such tasks must then be executed effectively and simultaneously in a single cell element field. The advantages of real time applications are obvious. Furthermore it is also possible to operate the individual sequencer structures that are constructed in a cell element field, providing the control connection according to the present invention, at different clock rates, e.g., to lower power consumption by executing lower priority tasks at a slower rate. It is also possible to execute sequencer type program parts in the field in parallel or vectorially in execution of algorithms that are largely parallel per se and vice versa.

Typically, however, it is preferable for sequencer-type structures to be clocked at a higher rate in the cell element field, whether they are sequencer-type structures having an area connected to neighboring cells or buses or whether they are combinations of spatially differentiable separate and separately useable function cell elements such as ALU-PAEs and memory cell elements such as RAM-PAEs. This has the advantage that sequential program parts, which are very difficult to parallelize in any case, may be used in a general data flow processing without any negative effect on the overall data processing. Examples of this include, e.g., a HUFFMANN coding which is executable much better sequentially than in parallel and which also plays an important role for applications such as MPEG4 coding, but in this case the essential other parts of the MPEG4 coding are also easily parallelizable. Parallel data processing is then used for most parts of an algorithm and a sequential processing block is provided therein. An increase in the clock frequency in the sequencer range by a factor of 2 to 4 is typically sufficient.

It should be pointed out that instead of a strip arrangement of different cell elements, another grouping, in particular a multidimensional grouping, may also be selected.

The cell element field having the cells whose function and/or interconnection is configurable may obviously form a processor, a coprocessor and/or a microcontroller and/or a parallel plurality of combinations thereof.

The function cells are typically formed as arithmetic logic units, which may be in particular coarsely granular elements but may also be provided with a fine granular state machine, for example. In a particularly preferred exemplary embodiment, the ALUs are extended ALUs (EALUs) as described in previous patent applications of the present applicant. An extension may include in particular the control line check, command decoder unit, etc., if necessary.

The memory cells may store data and/or information in a volatile and/or nonvolatile form. When information stored in the memory cells, whether program steps, addresses for access to data or data stored in a register-type form, i.e., a heap is stored as volatile data, a complete reconfiguration may take place during run time. Alternatively it is possible to provide nonvolatile memory cells. The nonvolatile memory cells may be provided as an EEPROM area and the like, where a rudimentary BIOS program that is to be executed on boot-up of the system is stored. This permits booting up a data processing system without additional components. A nonvolatile data memory may also be provided if it is decided for reasons of cost and/or space that the same program parts are always to be executed repeatedly, and it is also possible to alternate among such fixed program parts during operation, e.g., in the manner of a wave reconfiguration. The possibilities of providing and using such nonvolatile memories are the object of other protective rights of the present applicant. It is possible to store both volatile and nonvolatile data in the memory cells, e.g., for permanent storage of a BIOS program, and nevertheless be able to use the memory cell for other purposes.

The memory cell is preferably designed to be able to store a sufficient variety of data to be executed and/or program parts to be executed. It should be pointed out here that these program parts may be designed as program steps, each specifying what an individual PAE, in particular the assigned PAE, i.e., in particular the function cell controlling the memory cell, is to do in the next step, and they may also include entire configurations for field areas or other fields. In such a case, it is readily possible for the sequencer structure that has been created to issue a command on the basis of which cell element field areas are reconfigured. The function cell triggering this configuration then operates as a load logic at the same time. It should be pointed out that the configuration of other cells may in turn be accomplished in such a way that sequencer type data processing is performed there and it is in turn possible in these fields to configure and/or reconfigure other cells in the course of program execution. This results in an iterative configuration of cell element areas, and nesting of programs having sequencer structures and parallel structures is possible, these structures being nested one inside the other like babushka dolls. It should be pointed out that access to additional cell element fields outside of an individual integrated module is possible through input/output cells in particular, which may massively increase the total computation performance. It is possible in particular when configurations occur in a code part of a sequencer structure configured into a cell element field to perform, if necessary, the configuration requirements on an assigned cell element field which is managed only by the particular sequencer structure and/or such requirements may be issued to a configuration master unit to ensure that there is uniform occupancy of all cell element fields. This therefore results in a quasi-subprogram call by transferring the required configurations to cells or load logics. This is regarded as independently patentable. It should be pointed out that the cells, if they themselves have responsibility for configuration of other cell element field areas, may be provided with FILMO structures and the like implemented in hardware or software to ensure proper reconfiguration. The possibility of writing to memory cells while executing instructions, thereby altering the code, i.e., the program to be executed, should be pointed out. In a particularly preferred variant, however, this type of self-modification (SM) is suppressed by appropriate control via the function cell.

It is possible for the memory cell to send the information stored in it directly or indirectly to a bus leading to the function cell in response to the triggering of the function cell controlling it. Indirect output may be accomplished in particular when the two cells are adjacent and the information requested by the triggering must arrive at the ALU-PAE via a bus segment that is not directly connectable to the output of the memory cell. In such a case the memory cell may output data onto this bus system in particular via backward registers. It is therefore preferable if at least one memory cell and/or function cell has such a backward register, which may be situated in the information path between the memory cell and function cell. In such a case, these registers need not necessarily be provided with additional functionalities, although this is readily conceivable, e.g., when data is requested from the memory cell for further processing, corresponding to a traditional LOAD of a typical microprocessor for altering the data even before it is loaded into the PAE, e.g., to implement a LOAD++ command. Data conduction through PAEs having ALUs and the like operating in the reverse direction should be mentioned.

The memory cell is preferably situated to receive information from the function cell controlling it, information saving via an input/output cell and/or a cell that does not control the memory cell also being possible. In particular when data is to be written into the memory cell from an input/output cell, it is preferable if this input/output cell (I/O-PAE) is also controlled by the function cell. The address at which information to be written into the memory cell or, if necessary, to also be transmitted directly to the function cell (PAE) is to be read, may also be transferred to the I/O-PAE from the ALU-PAE. In this connection it should be pointed out that this address may be determined via an address translation table, an address translation buffer or an MMU type structure in the I/O-PAE. In such a case, this yields the full functionalities of typical microprocessors. It should also be pointed out that an I/O functionality may also be integrated with a function cell means, a memory cell means and/or a function cell means-memory cell means combination.

In a preferred variant, at least one input-output means is thus assigned to the combination of function cells and memory cells, whether as an integrated function cell and a memory cell combination or as a function cell and/or memory cell combination composed of separate units, the input/output means being used to transmit information to and/or receive information from an external unit, another function cell, function cell memory cell combination and/or memory cells.

The input-output unit is preferably likewise designed for receiving control commands from the function cell and/or the function cell means.

In a preferred variant, the control connection is designed to transmit some and preferably all of the following commands:
OPCODE FETCH,
DATA WRITE INTERNAL,
DATA WRITE EXTERNAL
DATA READ EXTERNAL,
ADDRESS POINTER WRITE INTERNAL,
ADDRESS POINTER WRITE EXTERNAL,
ADDRESS POINTER READ INTERNAL,
ADDRESS POINTER READ EXTERNAL,
PROGRAM POINTER WRITE INTERNAL,
PROGRAM POINTER WRITE EXTERNAL,
PROGRAM POINTER READ INTERNAL,
PROGRAM POINTER READ EXTERNAL,
STACK POINTER WRITE INTERNAL,
STACK POINTER WRITE EXTERNAL,
STACK POINTER READ INTERNAL,
STACK POINTER READ EXTERNAL,
PUSH,
POP,
PROGRAM POINTER INCREMENT.

This may be accomplished through a corresponding bit width of the control line and an associated decoding at the receivers. The particular required control means and decoding means may be provided inexpensively and with no problems. As it shows, a practically complete sequencer capability of the arrangement is obtained with these commands. It should also be pointed out that a general-purpose processor data processing unit is obtained in this way.

The system is typically selected so that the function cell is the only one able to access the control connection and/or a bus segment, i.e., bus system functioning as the control connection as a master. The result is thus a system in which the control line functions as a command line such as that provided in traditional processors.

The function cell and the memory cell, i.e., I/O cell, are preferably adjacent to one another. The term "adjacent" may be understood preferably as the cells being situated directly side by side. "Directly" means in particular a combination of such cells to form integrated units which are provided repeatedly on the cell element field, i.e., as part of same to form the field. This may mean an integral unit of memory cells and logic cells. Alternatively, they are at least close together. The system of the function cells and memory cells in integrated, i.e., close, proximity to one another thus ensures that there are no latency times, or at least no significant latency times, between triggering and data input of the required information in the function cell, merely because the connections between the cells are too long. This is understood to be "direct." If latency times must be taken into account, pipelining may then also be provided in the sequencer structures. This is particularly important in the case of systems with very high clock rates. It should be pointed out that it is readily possible to provide cell units clocked at a suitably high frequency such as those known in the related art per se which are also able to access suitable memory cells with appropriate speed. In such a case, e.g., when architecture elements that are known per se are used for the function cells, reconfigurability of the function cell element and the corresponding interconnections must be provided. In a particularly preferred variant, the function cells, the information providing cells such as memory cells, I/O cells and the like are arranged multidimensionally, in particular in the manner of a matrix, i.e., on grid points of a multidimensional grid, etc. If there is a regular structure, as is the case there, information, i.e., operands, configurations, trigger signals, etc., is typically supplied to a cell from a first row, while data, trigger signals and other information is dispensed in a row beneath that. In such a case, it is preferable if the cells are situated in one and the same row and the information transfer from the information-providing cell into the required input into the function cell may then take place via a backward register. The possibility of using the registers for pipelining should also be mentioned.

Patent protection is also claimed for a method for operating a cell element field, in particular a multidimensional cell element field having function cells for execution of algebraic and/or logic functions and information-providing cells, in particular memory cells and/or input/output cells for receiving and/or outputting and/or storing information, at least one of the function cells outputting control commands to at least one information-providing cell, information for the function cell being provided there in response to the control commands, and the function cell being designed to perform the additional data processing in response to the information thus provided to thereby process data in the manner of a sequencer at least from time to time.

Sequencer-type data processing is thus made possible in a reconfigurable field by output of the control commands to the memory cell of the sequencer structure. The commands which may be output as control commands by the function cell permit a sequencer type operation such as that known from traditional processors. It should be pointed out that it is readily possible to implement only parts of the aforementioned commands but nevertheless ensure data processing that is completely of the sequencer type.

The present invention is described in greater detail below and as an example on the basis of the drawing, in which.

Figure 2A:
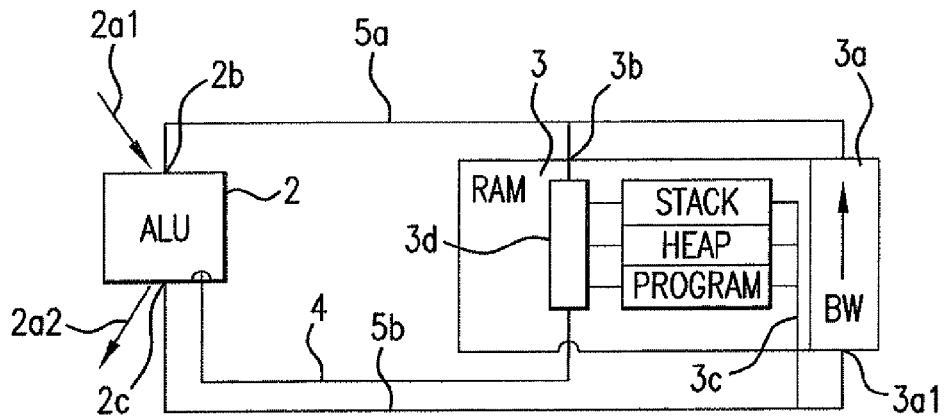
FIG. 2a shows a detail thereof.
Figure 2B:
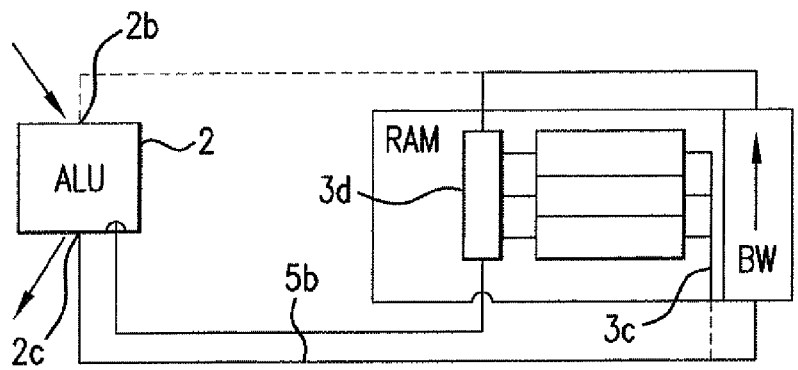
Figure 2C:
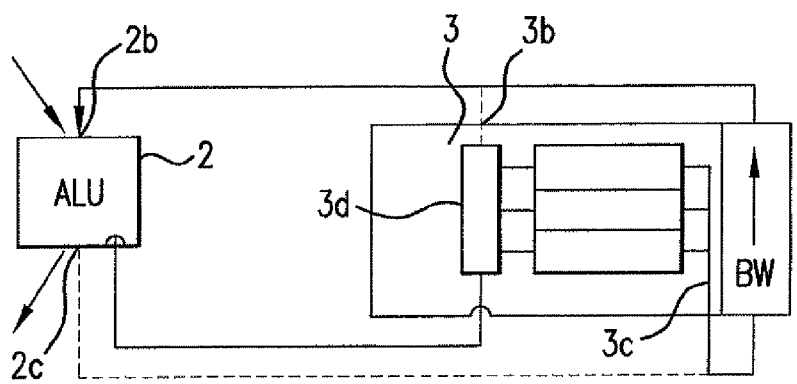
Figure 3:
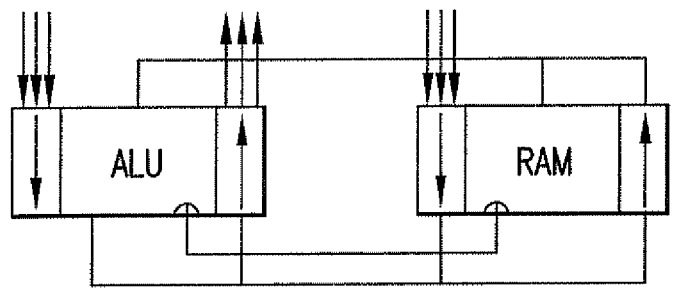
Figure 4:
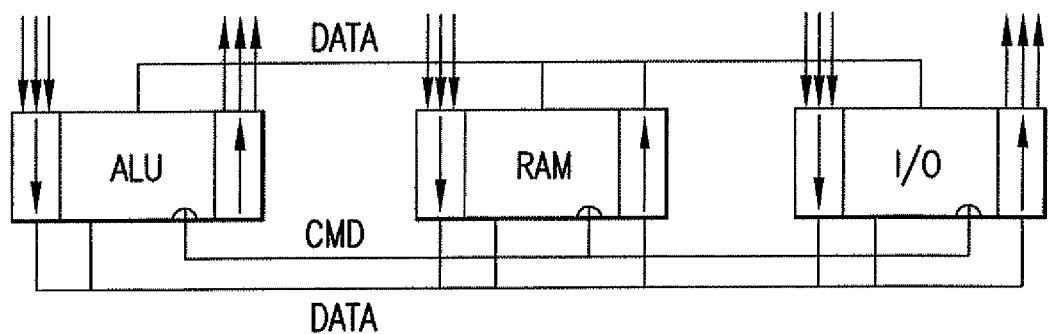
Figure 5:
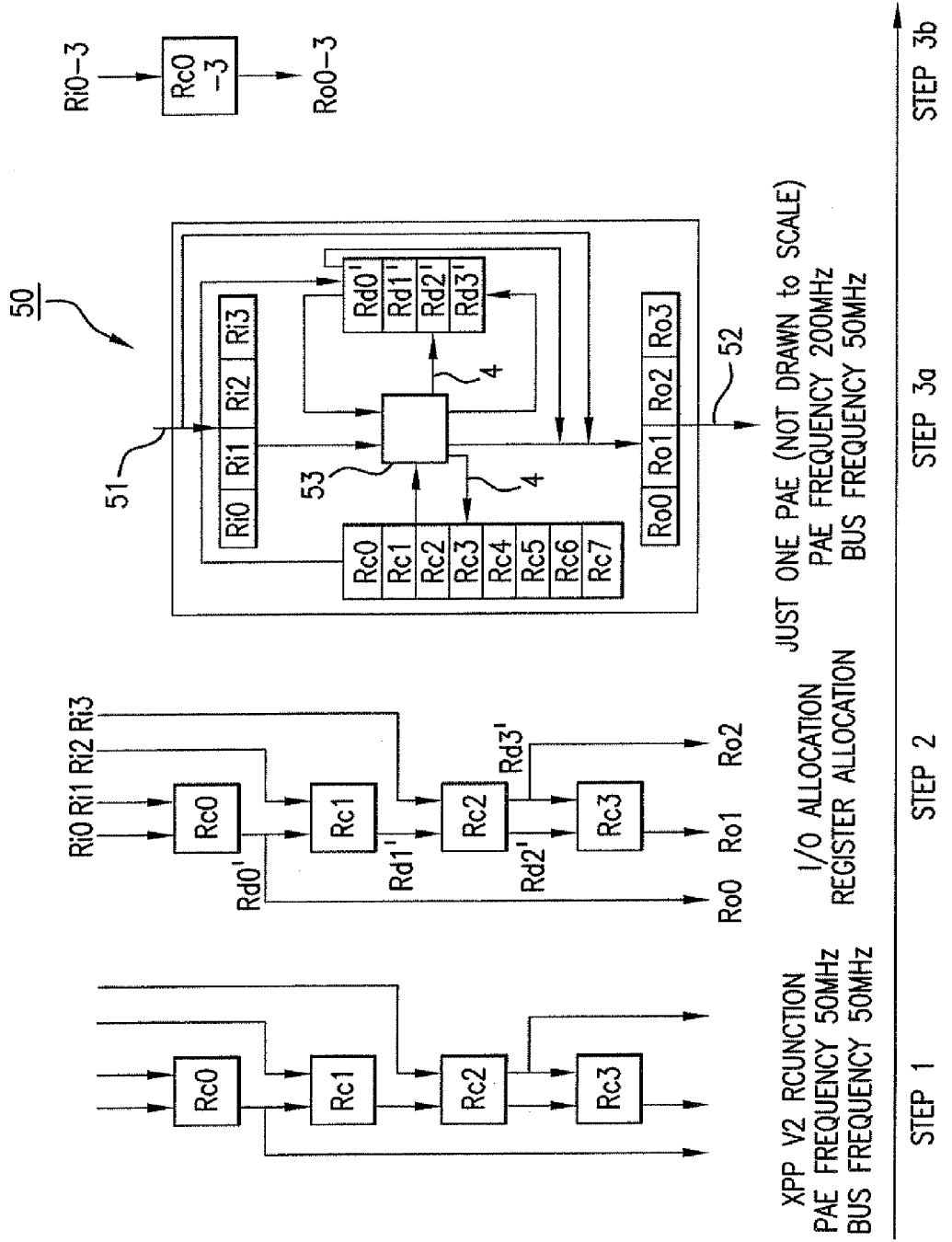
Figure 6A:
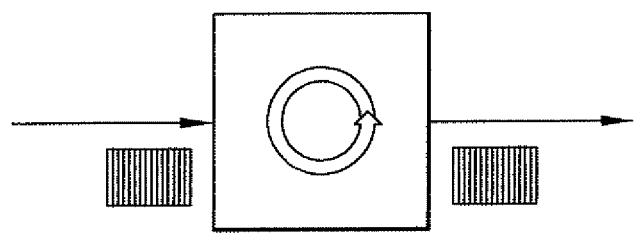
Figure 6B:
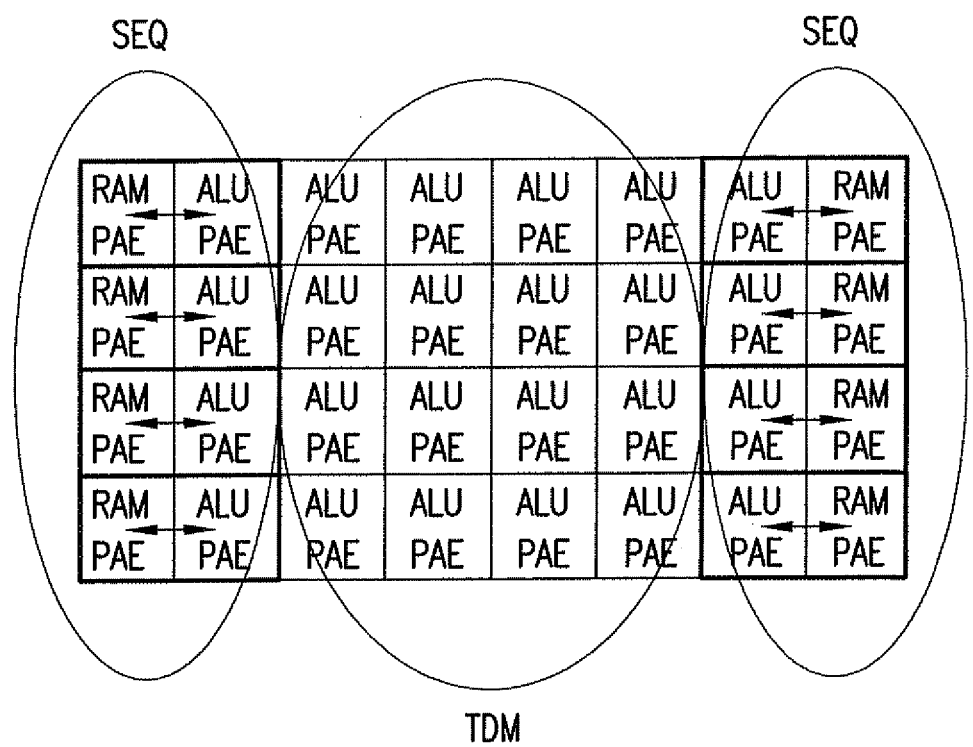
Figure 7:
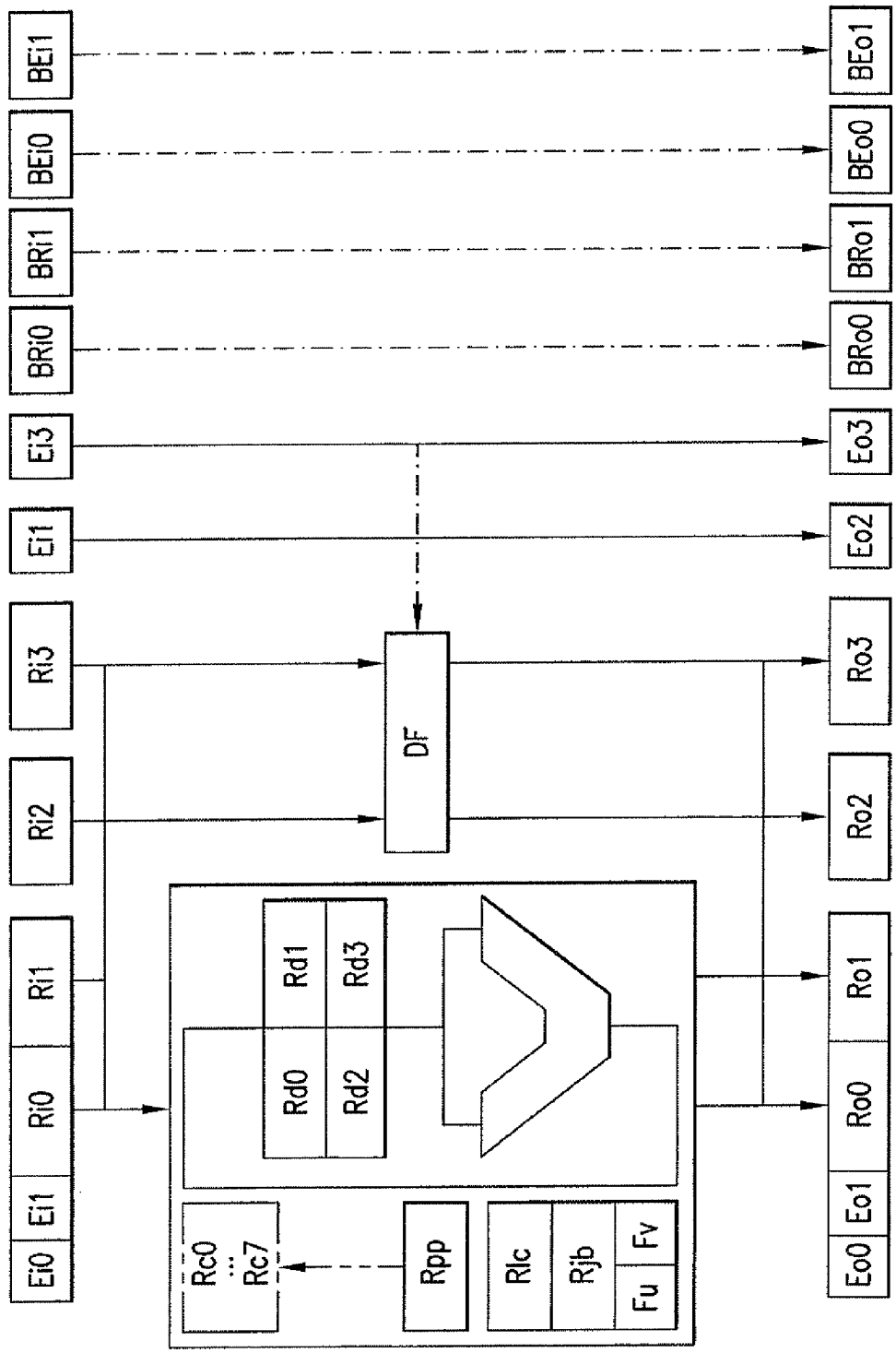

FIGS. 2b, c show the detail from FIG. 2a during various data processing times,

FIG. 3 shows an alternative embodiment of the detail from FIG. 2,

FIG. 4 shows a particularly preferred variant of the detail,

FIG. 5 shows an example of the function folding onto a function cell-memory cell combination according to the present invention, FIG. 6a shows an example of sequential parallel data processing FIG. 6b shows a particularly preferred exemplary embodiment of the present invention FIG. 7 shows an alternative to a function folding unit.

Figure 1:
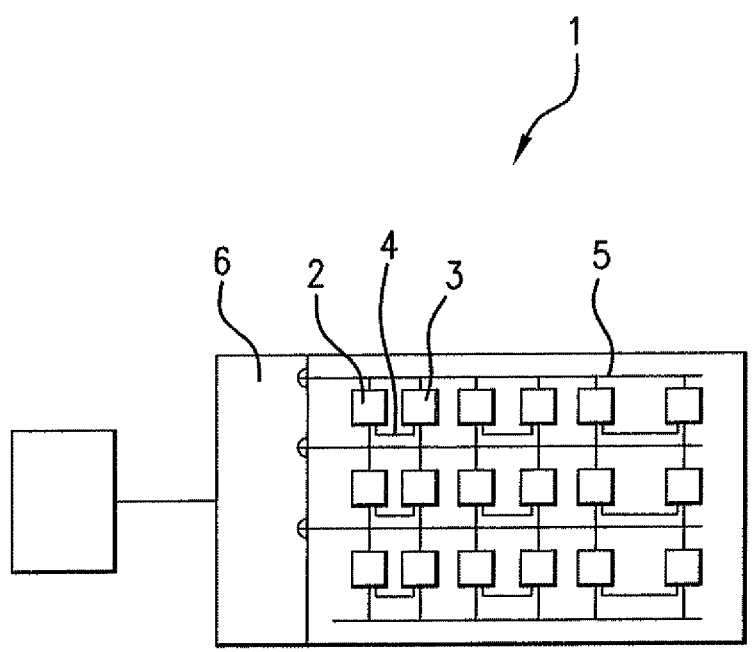
FIG. 1 shows a cell element field according to the present invention.

According to FIG. 1, a cell element field 1 for data processing includes function cell means 2 for execution of arithmetic and/or logic functions and memory cell means 3 for receiving, storing and/or outputting information, a control connection 4 connecting function cells 2 to memory cells 3.

Cell element field 1 is freely configurable in the interconnection of elements 2, 3, 4, namely without interfering with ongoing operation of cell element parts that are not to be reconfigured. The connections may be configured by switching bus systems 5 as necessary. In addition, the particular functions of function cells 2 are configurable. The function cells are arithmetic logic units extended by certain circuits that permit reconfiguration, e.g., state machines, interface circuit for communication with external load logic 6, etc. Reference is made to the corresponding previous applications of the present applicant.

Cell elements 2, 3 of cell element field 1 are arranged two-dimensionally in rows and columns, one memory cell 3 being situated directly next to a function cell 2 with three memory cell-function cell pairs per row, the function cells and memory cells being interconnected by control connections 4. Function cells and memory cells 2, 3, or the combination thereof have inputs which are connected to the bus system above the row in which the particular cell element is located to receive data therefrom. In addition, cells 2, 3 have outputs which output data to bus system 5 below the row. As explained below, each memory cell 3 is also provided with a backward register (BW) through which data from the bus below a row may be guided through to the bus above the particular row.

Memory cell means 3 preferably has at least three memory areas, namely a data area, a program memory area and a stack area, etc. However, in other variants of the present invention it may be adequate provide only two areas, namely a data memory and a program area memory, each optionally forming part of a memory cell means. It is possible in particular to perform not simply a separation of a memory that is identical in terms of hardware and is homogeneous per se into different areas but instead to provide memory areas that are actually separated physically, i.e., in terms of hardware technology. In particular the memory width and/or depth may also be adapted to the particular requirements. When a memory is designed in such a way that it has a program area and a data area in operation, it is preferable to design this memory, i.e., memory area for simultaneous access to data and program memory areas, e.g., as a dual port memory. It may also be possible to provide closely connected memory areas, in particular within a memory cell means-function cell means combination formed into an integrated area as a pure cache memory into which data from remote memory sites is preloaded for rapid access during data processing.

Except for control connections 4 and the particular circuits within the function cells (ALU in FIG. 2) and/or memory cells (RAM in FIG. 2), the cell element field for data processing in FIG. 1 is a traditional cell element field such as that which is known and conventional with reconfigurable data processing systems, e.g., a VPU according to XPP technology of the present applicant. In particular, the cell element field of FIG. 1 may be operated in the known way, so it has the corresponding circuits for wave reconfiguration, for debugging, transferring trigger signals, etc.

The first distinguishing features of the cell element field of the present invention are derived from control connection 4 and the corresponding circuit, which are described in greater detail below with reference to FIGS. 2a through 2c. It should be pointed out that whereas in FIG. 1, a control connection 4 always leads from a function cell element located farther to the left to a memory cell located farther to the right, specifically only and exactly to one such memory cell, it is also plausibly possible to provide a configurable interconnection for the control lines to be able to address either memory cells situated elsewhere and/or more than one memory cell, if necessary, when there is a great memory demand for information to be received, stored and/or output by the memory cells. For reasons of comprehensibility, however, only individual control connections which are provided in a fixed manner are referred to in FIGS. 1 and 2, which greatly simplifies understanding of the present invention. The control connection is also substitutable if necessary by traditional lines, assuming the proper protocols are available.

FIG. 2 shows function cell 2 as an ALU and function cell 3 as a RAM. Above the row in which the cells are located runs bus 5a, connecting backward register 3a mentioned above to inputs 3b of the memory cell and 2b of the ALU. The bus system running below the cell is labeled as 5c and only the relevant segments of bus system 5a, 5b are shown here. It is apparent that bus system 5b alternatively receives data from an output 2c of ALU 2, an output 3c of RAM 3 and carries data into input 3a1 of the backward register.

ALU 2 at the same time has additional inputs and outputs 2a1, 2a2 which may be connected to other bus segments and over which the ALU receives data such as operands and outputs results.

Control connection 4 is permanently under control of the extended circuits of the ALU and represents here a connection over which a plurality of bits may be transferred. The width of control connection 4 is selected so that at least the following control commands may be transmitted to the memory cell: DATA WRITE, DATA READ, ADDRESS POINTER WRITE, ADDRESS POINTER READ, PROGRAM POINTER WRITE, PROGRAM POINTER READ, PROGRAM POINTER INCREMENT, STACK POINTER WRITE, STACK POINTER READ, PUSH, POP. Memory cell 3 at the same time has at least three memory areas, namely a stack area, a heap area and a program area. Each area is assigned its own pointer via which it is determined to which area of the stack, the heap and the program area there will be read or write access in each case.

Bus 5a is used jointly by units 2 and 3 in time multiplex. This is indicated in FIGS. 2b, 2c. FIG. 2b illustrates a situation in which data may be sent from output 2a2 of ALU-PAE to the input of the RAM cell via the backward register, whereas the concurrently existing but unused connection between output 3c of the RAM to bus 5b and the connection between the output of backward register BW to input 2b of the ALU-PAE at the point in time of FIG. 2b is of no importance, which is why this is indicated with dashed lines. In contrast, FIG. 2c shows a point in time at which memory cell 3 supplies information via its output 3c and the backward register to input 2b of ALU-PAE 2 from the stack, heap or program memory area via control line 4, while the output of ALU-PAE 2c is inactive and no signal is received at input 3b of the RAM-PAE. For this reason, the corresponding connections are indicated with dash-dot lines and are thus depicted as being inactive.

Within RAM cell 3, a circuit 3d is provided in which the information received via control line 4 and/or control line bus segment 4 is decoded.

The present invention is used as follows:

First, ALU 2 receives configuration information from a central load logic, as is already known in the related art. The transfer of information may take place in a manner known per se using the RDY/ACK protocol and the like. Reference is made to the possibility of providing a FILMO memory, etc., with the load logic to permit a proper configuration of the system.

Simultaneously with the data for configuring ALU 2, a series of data is transmitted from the load logic, representing a program, i.e., program part to be executed in the manner of a sequencer. Reference is made in this regard only as an example to FIG. 6a in which the HUFFMANN coding is depicted as a central sequential part of an MPEG4 coding which is performed in the manner of data flow per se. The ALU therefore outputs a corresponding command to line 4 during its configuration, this command setting the program pointer for writing at a preselected value within the RAM. The load logic then supplies data received by the ALU over output 2c and via bus 5b1 and backward register 3a, the data going from there to input 3b of RAM-PAE 3. According to the control command on control line 4, data is then written from unit 3d to the program memory location indicated. This is repeated until all the program parts received by the load logic in configuration have been stored in memory cell 3. When the configuration of the ALU is then concluded, the ALU will request the next program steps to be executed by it in the manner of a sequencer by outputting the corresponding commands on control line 4 and will receive the program steps via output 3c, bus 5b, the backward register of RAM-PAE 3 and bus 5a at its input. During program execution, situations may occur in which jumps are necessary within the program memory area, data must be loaded into the ALU-PAE from the RAM-PAE, data must be stored in the stack, etc. The communication in this regard between the ALU-PAE and RAM-PAE is accomplished via control line 4 so that the ALU-PAE is able to execute decoding at any point in time. Moreover, as in a traditional microprocessor, data from a stack or another RAM memory area may be received and in addition, data may also be received in the ALU-PAE from the outside as operands.

The program sequence preconfigured in the RAM-PAE by the load logic is executed here. At the same time, command decoding is performed in the ALU-PAE as is necessary per se. This is done with the same circuits per se as those used already for decoding the commands received by the load logic.

At any point in time control line 4 is controlled via the ALU so that the RAM cell always exactly follows the type of memory access specified by the ALU. This ensures that regardless of the time multiplex use of bus elements 5a, b the elements present in the sequencer structure are instructed at all times whether addresses for data or codes to be retrieved or to be written is on the buses or whether and if so where data is to be written, etc.

The system shown with respect to FIG. 2 may be extended or modified in different ways. The variants depicted in FIGS. 3, 4 and 6 are particularly relevant.

According to FIG. 3, not only a backward register is provided on the RAM-PAE for connecting upper buses and lower buses, but also a forward register is provided on the RAM-PAE and forward and backward registers are provided on the ALU-PAE. As indicated by the multiple arrows, these may receive data from other units such as external hosts, external peripherals such as hard drives, main memories and the like and/or from other sequencer structures, PAEs, RAM-PAEs, etc., and send data to them. When an appropriate request command for new program parts from the sequencer structure formed by the ALU-PAE and the RAM-PAE is sent out, it is possible to process program blocks in the sequencer structure which are much larger than those storable in the RAM-PAE. This is an enormous advantage in particular in complex data processing tasks, jumps over wide areas, in particular in subprograms, etc.

FIG. 4 shows an even more preferred variant where the ALU-PAE communicates not only with a RAM-PAE but also at the same time with an input/output PAE which is designed to provide an interface circuit for communication with external components such as hard drives, other XPP-VPUs, external processors and coprocessors, etc. The ALU-PAE is in turn the unit which operates as the master for the control connection referred to as "CMD" and the buses are in turn used in multiplex mode. Here again, data may be transferred from the bus below the row to the bus above the row through the backward register.

The system shown in FIG. 4 permits particularly easy external access to information stored in the RAM-PAE memory cell and thus allows an adaptation of the sequencer structure to existing traditional CPU technologies and their operating methods to an even greater extent inasmuch as address translation means, memory management units (MMU functions) and the like may be implemented in the input-output cell. The RAM-PAE may function here as a cache, for example, but in particular as a preloaded cache.

It should be pointed out that multiple sequencer structures may be configured into one and the same field at the same time; that function cells, memory cells and, if necessary, input-output cells may optionally be configured for sequencer structures and/or in a traditional manner for XPP technology and that it is readily possible for one ALU to output data to another ALU, which configures it as a sequencer and/or makes it part of a cell element field with which a certain configuration is executed. In this way, the load logic may then also become dispensable, if necessary.

According to FIG. 6, two embodiments of the present invention are combined in one and the same cell element field, namely at the edges of sequencers formed by two PAEs, namely by one RAM-PAE and one ALU-PAE, and in the interior sequencers formed by integrated RAM-ALU-PAEs as integrated function cell-memory cell units, where it is possible to form only part of the cells inside the field as combination cells.

FIG. 5 shows at the right (FIG. 5c) a function cell-memory cell means combination.

According to FIG. 5c, a function cell-memory cell means combination labeled as 50 in general includes bus connections, i.e., bus inputs 51 for the input of operand data and configuration data and, as is preferably also possible here in particular, trigger signals (not shown) and the like and a bus output 52 for output of corresponding data and/or signals. Within the function cell means-memory cell means combination, an ALU 53 is provided as well as input registers Ri0 through Ri3 for operand data and trigger signal input registers (not shown). Configuration data registers Rc0 through Rc7 for configuration data, i.e., ALU code data, result data registers Rd0'-R3' and output registers Ro0 through Ro3 for results, i.e., trigger signals to be output. Registers Re and Rd for the configuration data, i.e., opcode data, are triggered by ALU 53 via control command lines 4 and supply data over suitable data lines to the ALU and/or receive result data from it. It is also possible to supply information directly from bus 51 and/or input registers Ri directly to the output registers, i.e., bus 52, exactly as information may be supplied from data registers Rd0 not only to the ALU, but also to the output registers. If necessary, connections may be provided between memory areas Rd and Rc, e.g., for implementation of the possibility of self-modifying codes.

Configuration data area Rc0 through Rc7 has a control unit which makes it possible to work in parts of the area, in particular in repeated cycles and/or through jumps. For example, in a first partial configuration, commands in Rc0 through Rc3 may be executed repeatedly, and alternatively configuration commands in Rc4 through Rc7 may be executed, e.g., on receipt of an appropriate different trigger signal over bus line 51. This ensures executability of a wave configuration. It should be pointed out that the configuration commands input are typically only instructions to the ALU but do not define complete bus connections, etc.

The unit described above, illustrated in FIG. 5, is designed here to be operated with a quadruple clock pulse, like a normal PAE without memory cell means and/or control signal lines 4.

To process data sequencer-style in a data flow in the function folding unit designed in this way, data flow graphs and/or areas according to FIG. 5a are created at first for preselected algorithms. Memory areas Rc0 are then assigned to each operation to be executed in the graph; incoming data into the graph partial area is assigned to internal input registers Ri0; the interim results are assigned to memories Rd0 through Rd3 and the output results are assigned to registers Ro. With this assignment, the graph area is executable on the function folding unit. This results more or less in a data flow-sequencer transformation by this hardware.

It should be mentioned in this context that it will be preferable in general to use the system of the present invention in such a way that first a data flow graph and a control flow graph are created for a data processing program using a compiler and then a corresponding partitioning is performed; the pieces obtained by the partitioning may then be executed partially or entirely on sequencer units such as those which may be formed according to the present invention, for example. This more or less achieves data processing in the manner of data flow progressing from one cell to the next, but effects a sequential execution within the cell(s). This is advantageous when the clock frequency is to be increased because of the extremely high computation power of a system to be able to reduce the area and/or number of cells. It should also be pointed out that it is possible to perform this transformation like transition from a purely data flow type of data processing to data flow processing with local sequential parts in such a way that an iterative process is carried out, e.g., in such a manner that first a first partitioning is performed, and if it is then found in the subsequent "rolling up" of the partitioned parts on sequencer units that the resources available on the sequencers or at other sites, for example, are not sufficient, another partitioning taking this into account may be performed and a new "rolling up" may be performed. If extensive use of the function folding units is desired, the number of registers may be increased, if necessary.

It should also be pointed out that the registers in this case may be interpreted as memory cell means or parts thereof. It is apparent that by increasing the memory cell areas, more complex tasks may be arranged in particular in a sequencer fashion but significant parts of important algorithms may be executed with the small sizes indicated and this may be done with high efficiency.

In the present example, the function folding units are preferably formed in such a way that data may be shifted through them without being processed in the ALU. This may be utilized to achieve path balancing in which data packets must be executed via different branches and then recombined without having to use forward registers such as those known from the architecture of the present applicant. At the same time and/or alternatively, it is possible for the direction of data flow not to run strictly in one direction in the cell element field through an appropriate orientation of a few function cell means, memory cell means, or function folding units but instead to have the data flow run in two opposite directions. Thus, for example, in each even row the ALUs receive their input operands from the left side and in each uneven row the ALUs receive their input operands from the right.

If data must be sent repeatedly through the field, such an arrangement is advantageous, e.g., in the case of unrolled looped bodies, etc. The alternating arrangement need not be strict. For certain applications, other geometries may be selected. For example, a different direction of flow may be selected for the middle of the field than at the edges, etc. The arrangement of function cell units of the same direction of flow side by side may be advantageous with respect to the bus connections. It should be pointed out that the arrangement in opposite directions of multiple directional function cells in one field and the resulting improved data processing independently of providing a control line or the like are regarded as inventive.

FIG. 7 shows an alternative to the function folding unit shown in FIG. 5.

What is claimed is:

1. A data processor chip comprising:
a plurality of data processing elements each including at least one arithmetic-logic-unit;
a plurality of memory elements adapted for storing at least one of program data and program code;
at least one input/output element adapted for transmitting data to and receiving data from at least one of a high level memory and peripherals; and
a bus system;
wherein:
   each of the data processing, memory, and input/output elements is dedicated to its respective function and separate from each other;
   the bus system interconnects the data processing, memory, and input/output elements for transmitting data between specific ones of the elements according to a setting of the bus system at runtime; and
   each of the data processing, memory, and input/output elements is flexibly connectable for transmitting data to at least one other of the data processing, memory, and input/output elements depending on the setting of the bus system at runtime.

2. A data processor chip comprising:
a plurality of data processing elements each including at least one arithmetic-logic unit;
a plurality of memory elements adapted for storing at least one of program data and program code;
at least one input/output element adapted for transmitting data to and receiving data from at least one of a high level memory and peripherals; and
a bus system;
wherein each of the data processing, memory, and input/output elements is dedicated to its respective function and separate from each other;
the bus system interconnects the data processing, memory, and input/output elements for transmitting data between specific ones of the elements according to a setting of the bus system; and
each of the data processing, memory, and input/output elements is adapted for transmitting data to at least one other of the data processing, memory, and input/output elements depending on the setting of the bus system.

3. A computer system including:
a data processor chip having a plurality of data processing elements each including at least one arithmetic-logic unit;
a plurality of memory elements adapted for storing at least one of program data and program code;
at least one input/output element adapted for transmitting data to and receiving data from at least one of a high level memory and peripherals; and
a bus system;
wherein each of the data processing, memory, and input/output elements is dedicated to its respective function and separate from each other;
the bus system interconnects the data processing, memory, and input/output elements for transmitting data between specific ones of the elements according to a setting of the bus system; and
each of the data processing, memory, and input/output elements is adapted for transmitting data to at least one other of the data processing, memory, and input/output elements depending on the setting of the bus system.

4. A computer system including:
a plurality of data processing elements each including an arithmetic-logic unit;
a plurality of memory elements adapted for storing at least one of program data and program code;
at least one input/output element adapted for transmitting data to and receiving data from at least one of a high level memory and peripherals; and
a bus system;
wherein each of the data processing, memory, and input/output elements is separate from the others of the data processing, memory and input/output elements, and each of the data processing, memory, and input/output elements is adapted specifically to perform respectively the functions of data processing, memory storage, and input/output; and
the bus system interconnects the data processing, memory, and input/output elements such that specific pairs of the elements are interconnected depending upon a setting of the bus system.

* * * * *